(12) United States Patent
Yamazaki et al.

(10) Patent No.: US 9,236,385 B2
(45) Date of Patent: *Jan. 12, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Masashi Tsubuku, Kanagawa (JP); Kosei Noda, Kanagawa (JP); Kouhei Toyotaka, Kanagawa (JP); Kazunori Watanabe, Kanagawa (JP); Hikaru Harada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,142

(22) Filed: Jul. 21, 2014

(65) Prior Publication Data

US 2014/0337603 A1 Nov. 13, 2014

Related U.S. Application Data

(63) Continuation of application No. 12/907,722, filed on Oct. 19, 2010, now Pat. No. 8,803,142.

(30) Foreign Application Priority Data

Oct. 21, 2009 (JP) ................................ 2009-242871

(51) Int. Cl.
*H01L 29/04* (2006.01)
*H01L 29/12* (2006.01)
(Continued)

(52) U.S. Cl.
CPC .......... *H01L 27/10805* (2013.01); *G06F 15/76* (2013.01); *H01L 27/10873* (2013.01);
(Continued)

(58) Field of Classification Search
CPC .. H01L 27/1225; H01L 29/24; H01L 29/7869
See application file for complete search history.

(56) References Cited

U.S. PATENT DOCUMENTS

| 4,471,428 A | 9/1984 | Dshkhunian et al. |
| 5,056,004 A | 10/1991 | Ohde et al. |

(Continued)

FOREIGN PATENT DOCUMENTS

| CN | 001574079 A | 2/2005 |
| CN | 001691292 A | 11/2005 |

(Continued)

OTHER PUBLICATIONS

International Search Report (Application No. PCT/JP2010/067810) Dated Dec. 21, 2010.

(Continued)

*Primary Examiner* — Ha Tran T Nguyen
*Assistant Examiner* — Raj R Gupta
(74) *Attorney, Agent, or Firm* — Fish & Richardson P.C.

(57) ABSTRACT

An object is to provide a memory device including a memory element that can be operated without problems by a thin film transistor with a low off-state current. Provided is a memory device in which a memory element including at least one thin film transistor that includes an oxide semiconductor layer is arranged as a matrix. The thin film transistor including an oxide semiconductor layer has a high field effect mobility and low off-state current, and thus can be operated favorably without problems. In addition, the power consumption can be reduced. Such a memory device is particularly effective in the case where the thin film transistor including an oxide semiconductor layer is provided in a pixel of a display device because the memory device and the pixel can be formed over one substrate.

20 Claims, 28 Drawing Sheets

(51) Int. Cl.
  *H01L 29/78* (2006.01)
  *H01L 27/108* (2006.01)
  *H01L 27/11* (2006.01)
  *H01L 49/02* (2006.01)
  *H01L 29/786* (2006.01)
  *G06F 15/76* (2006.01)
  *H01L 29/24* (2006.01)
  *H01L 27/12* (2006.01)

(52) U.S. Cl.
  CPC ............ *H01L27/11* (2013.01); *H01L 27/1108* (2013.01); *H01L 27/1112* (2013.01); *H01L 28/60* (2013.01); *H01L 29/24* (2013.01); *H01L 29/7869* (2013.01); *H01L 27/1225* (2013.01)

(56) References Cited

U.S. PATENT DOCUMENTS

| | | |
|---|---|---|
| 5,278,459 A | 1/1994 | Matsui et al. |
| 5,694,061 A | 12/1997 | Morosawa et al. |
| 5,731,856 A | 3/1998 | Kim et al. |
| 5,744,864 A | 4/1998 | Cillessen et al. |
| 5,953,246 A | 9/1999 | Takashima et al. |
| 6,294,274 B1 | 9/2001 | Kawazoe et al. |
| 6,396,105 B1 | 5/2002 | Yamazaki et al. |
| 6,563,174 B2 | 5/2003 | Kawasaki et al. |
| 6,611,022 B2 | 8/2003 | Yamazaki et al. |
| 6,727,522 B1 | 4/2004 | Kawasaki et al. |
| 6,909,148 B2 | 6/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,200,050 B2 | 4/2007 | Kato |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III |
| 7,375,401 B2 | 5/2008 | Yamazaki et al. |
| 7,385,224 B2 | 6/2008 | Ishii et al. |
| 7,402,506 B2 | 7/2008 | Levy et al. |
| 7,403,435 B2 | 7/2008 | Kato |
| 7,411,209 B2 | 8/2008 | Endo et al. |
| 7,432,211 B2 | 10/2008 | Okamoto |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,812,351 B2 | 10/2010 | Yamazaki et al. |
| 7,863,611 B2 | 1/2011 | Abe et al. |
| 7,888,207 B2 | 2/2011 | Wager, III et al. |
| 7,935,582 B2 | 5/2011 | Iwasaki |
| 7,956,361 B2 | 6/2011 | Iwasaki |
| 8,084,331 B2 | 12/2011 | Ofuji et al. |
| 8,154,024 B2 | 4/2012 | Iwasaki |
| 8,193,045 B2 | 6/2012 | Omura et al. |
| 8,203,146 B2 | 6/2012 | Abe et al. |
| 8,304,298 B2 | 11/2012 | Ofuji et al. |
| 8,314,425 B2 | 11/2012 | Iwasaki et al. |
| 8,354,674 B2 | 1/2013 | Kimura |
| 8,384,077 B2 | 2/2013 | Yano et al. |
| 8,803,142 B2 * | 8/2014 | Yamazaki et al. ............... 257/43 |
| 2001/0046027 A1 | 11/2001 | Tai et al. |
| 2002/0056838 A1 | 5/2002 | Ogawa |
| 2002/0093061 A1 | 7/2002 | Yamazaki et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0065885 A1 | 4/2004 | Yamazaki et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0230755 A1 | 10/2005 | Yamazaki et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163743 A1 | 7/2006 | Kuwabara et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0224215 A1 | 9/2008 | Yamazaki et al. |
| 2008/0231354 A1 * | 9/2008 | Koyama ..................... 327/566 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |

(56) References Cited

U.S. PATENT DOCUMENTS

| | | |
|---|---|---|
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193785 A1 | 8/2010 | Kimura |
| 2010/0205519 A1 | 8/2010 | Ito et al. |
| 2010/0264419 A1 | 10/2010 | Iwasaki et al. |
| 2010/0276689 A1 | 11/2010 | Iwasaki |
| 2010/0279462 A1 | 11/2010 | Iwasaki |
| 2011/0175081 A1 | 7/2011 | Goyal et al. |
| 2013/0146452 A1 | 6/2013 | Yano et al. |

FOREIGN PATENT DOCUMENTS

| | | |
|---|---|---|
| CN | 101258607 A | 9/2008 |
| EP | 0725402 A | 8/1996 |
| EP | 1737044 A | 12/2006 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-180262 A | 6/1992 |
| JP | 05-251705 A | 9/1993 |
| JP | 08-241585 A | 9/1996 |
| JP | 08-264794 A | 10/1996 |
| JP | 09-246936 A | 9/1997 |
| JP | 09-289165 A | 11/1997 |
| JP | 11-505377 | 5/1999 |
| JP | 2000-044236 A | 2/2000 |
| JP | 2000-150900 A | 5/2000 |
| JP | 2001-053164 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-502597 | 1/2006 |
| JP | 2006-165527 A | 6/2006 |
| JP | 2006-165529 A | 6/2006 |
| JP | 2006-165532 A | 6/2006 |
| JP | 2006-310445 A | 11/2006 |
| JP | 2007-096055 A | 4/2007 |
| JP | 2007-103918 A | 4/2007 |
| JP | 2007-123861 A | 5/2007 |
| JP | 2008-270313 A | 11/2008 |
| JP | 2009-004733 A | 1/2009 |
| JP | 2009-010362 A | 1/2009 |
| JP | 2009-033145 A | 2/2009 |
| JP | 2009-176864 A | 8/2009 |
| JP | 2009-206508 A | 9/2009 |
| JP | 2009-212443 A | 9/2009 |
| KR | 10-0236213 | 12/1999 |
| WO | WO-2004/038757 | 5/2004 |
| WO | WO-2004/114391 | 12/2004 |
| WO | WO-2007/029844 | 3/2007 |
| WO | WO-2008/143304 | 11/2008 |
| WO | WO-2008/149873 | 12/2008 |
| WO | WO-2009/075281 | 6/2009 |
| WO | WO-2009/093724 | 7/2009 |
| WO | WO-2009/096608 | 8/2009 |
| WO | WO-2009/110623 | 9/2009 |

OTHER PUBLICATIONS

Written Opinion (Application No. PCT/JP2010/067810) Dated Dec. 21, 2010.

Fortunato.E et al., "Wide-Bandgap High-Mobility Zno Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Device Metting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett (Applied Physics Letters), Jun. 26, 2007, vol. 90, No. 26, pp. 262106-1-262106-3.

Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 69, No. 25, pp. 3650-3652.

Nakamura.M et al., "The phase relations in the $In_2O_3$-$Ga_2ZnO_4$-ZnO system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ As a Charge-Generation Layer", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 :SID International Symposium Digest of Technical Papers, May 31, 2009, pp. 919-193.
Jin.D et al., "65.2:Distinguished Paper:World-Largest (6.5") Flexible Full Color Top Emission AMOLED Display on Plastic Film and Its Bending Properties", SID Digest '09 :SID International Symposium Digest of Technical Papers, May 31, 2009, pp. 983-985.
Sakata.J et al., "Development of 4.0-In. AMOLED Display With Driver Circuit Using Amorphous In-Ga-ZN-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", Journal of the SID, 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Applications", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2012, vol. 1, pp. 64-68.
Kimizuka.N. et al., "Spinel,YbFe2O4, and Yb2Fe3O7 Types of Structures for Compounds in the In2O3 and Sc2O3-A2O3-Bo Systems [A; Fe, Ga, Or Al; B; Mg, Mn, Fe, Ni, Cu,Or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Botom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Itagaki.N. et al., "Zn-In-O based thin-film transistors:Compositional dependence", Physica Status Solida (a), Aug. 1, 2008, vol. 205, No. 8, pp. 1915-1919.

Korean Office Action (Application No. 2012-7024863) Dated Nov. 12, 2013.

European Search Report (Application No. 10824817.0) Dated Dec. 6, 2013.

Chinese Office Action (Application No. 201080047983.4) Dated Dec. 13, 2013.

Chinese Office Action (Application No. 201210173533.0) Dated Mar. 31, 2014.

Taiwanese Office Action (Application No. 101117372) Dated Jan. 9, 2015.

* cited by examiner

SEMICONDUCTOR DEVICE

CROSS-REFERENCE TO RELATED APPLICATIONS

This application is a continuation of U.S. application Ser. No. 12/907,722, filed Oct. 19, 2010, now allowed, which claims the benefit of a foreign priority application filed in Japan as Serial No. 2009-242871 on Oct. 21, 2009, both of which are incorporated by reference.

TECHNICAL FIELD

The present invention relates to semiconductor devices. In particular, the present invention relates to semiconductor devices including memory circuits (e.g., memory devices).

BACKGROUND ART

A technique by which transistors are formed using semiconductor thin films formed over a substrate having an insulating surface has been attracting attention. A transistor is used for a display device typified by a liquid crystal television. Silicon is known as a material for a semiconductor thin film applicable to a transistor; however, an oxide semiconductor has attracted attention in recent years.

As a material for the oxide semiconductor, zinc oxide or a material containing zinc oxide as its component is known (e.g., Patent Documents 1 and 2). Further, a transistor formed using an amorphous oxide (oxide semiconductor) having an electron carrier concentration of less than $10^{18}$ cm$^{-3}$ is disclosed (e.g., Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2006-165529

DISCLOSURE OF INVENTION

However, a difference from the stoichiometric composition in the oxide semiconductor arises in a thin film formation process. The electric conductivity of the oxide semiconductor changes due to the excess or deficiency of oxygen. Further, hydrogen that enters the oxide semiconductor during the formation of the thin film of the oxide semiconductor bonds with oxygen (an O—H bond is formed) and serves as an electron donor, which is a factor of changing the electric conductivity. Furthermore, since the O—H bond is a polar bond, it serves as a factor of varying characteristics of an active device such as a transistor manufactured using an oxide semiconductor.

Even when having an electron carrier concentration of less than $10^{18}$ cm$^{-3}$, an oxide semiconductor is a substantially n-type semiconductor, and an on-off ratio of the transistor disclosed in the Patent Documents 1 to 3 is about $10^3$. Such a low on-off ratio of the transistor is due to large off-state current. Here, the on-off ratio refers to a ratio of the value of on-state current to the value of off-state current.

In view of the above problems, it is an object of one embodiment of the present invention to provide a transistor having stable electric characteristics (e.g., excessively-low off-state current).

One embodiment of the present invention is a semiconductor device whose memory circuit includes a transistor in which a channel formation region is formed using an oxide semiconductor film. Hydrogen or OH group contained in the oxide semiconductor is removed so that the concentration of hydrogen contained in the oxide semiconductor is less than or equal to $5\times10^{19}$ cm$^{-3}$, preferably less than or equal to $5\times10^{18}$ cm$^{-3}$, more preferably less than or equal to $5\times10^{17}$ cm$^{-3}$, and carrier concentration is less than or equal to $5\times10^{14}$ cm$^{-3}$, preferably less than or equal to $5\times10^{12}$ cm$^{-3}$.

Here, the energy gap of the oxide semiconductor film is set to 2 eV or more, preferably 2.5 eV or more, still preferably 3 eV or more to reduce as many impurities (e.g., hydrogen), which form donors, as possible. Further, the carrier concentration of the oxide semiconductor film is set to less than or equal to $1\times10^{14}$ cm$^{-3}$, preferably less than or equal to $1\times10^{12}$ cm$^{-3}$.

The thus highly-purified oxide semiconductor is used for a channel formation region of a transistor. Accordingly, even in the case where the channel width is extremely long, which is 10 mm, the drain current of $1\times10^{-13}$ A or less can be obtained at drain voltages of 1 V and 10 V and gate voltages in the range of −5 V to −20 V.

With one embodiment of the present invention, by forming a circuit by using a transistor that includes a highly-purified oxide semiconductor film, stable operation of the circuit can be obtained. Since off-state current is lowered to less than or equal to $1\times10^{-13}$ A, a display device including the above-described circuit does not need to be additionally provided with a capacitor for holding a signal voltage applied to a pixel. That is, in the case where the circuit is applied to a display device, a storage capacitor is unnecessary for each pixel; thus, aperture ratio can be improved.

With one embodiment of the present invention, a display device including the above-described circuit can hold a fixed state of a pixel (e.g., a state in which an image signal is written); thus, stable operation can be obtained also in the case where a still image is displayed.

With one embodiment of the present invention, high field-effect mobility and low off-state current can be obtained; thus, a semiconductor device including a memory circuit that is operated favorably without problems and that has low power consumption can be obtained. A semiconductor device including such a memory circuit is particularly effective in the case where a transistor including an oxide semiconductor layer is provided in a pixel of a display device because the semiconductor device including the memory circuit and the pixel can be manufactured over one substrate.

BEST MODE FOR CARRYING OUT THE INVENTION

Figure 1A:
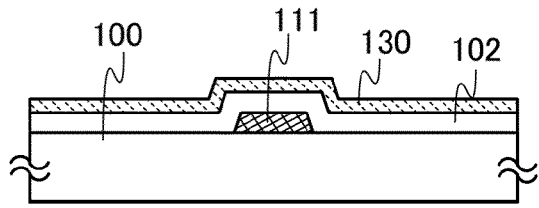
FIGS. 1A to 1E illustrate a transistor which is one embodiment of the present invention and a method for manufacturing the transistor.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and examples. Note that reference numerals denoting the same portions are commonly used in different drawings.

Note that the size, the thickness of a layer, or a region in structures illustrated in the drawings and the like in the embodiments are exaggerated for simplicity in some cases. Therefore, embodiments of the present invention are not limited to such scales.

Note that terms with ordinal numbers such as "first", "second", and "third" in this specification are used in order to identify components, and the terms do not limit the components numerically.

Embodiment 1

In this embodiment, a semiconductor device which is one embodiment of the present invention is described.

First, a transistor which can be used for the semiconductor device of this embodiment is described with reference to FIGS. 1A to 1E.

A transistor 110 illustrated in FIGS. 1A to 1E is an inverted staggered transistor having a bottom-gate structure.

Although the transistor 110 is a single-gate transistor, a multi-gate transistor having a plurality of channel formation regions may also be used as necessary.

First, after a conductive film is formed over a substrate 100 having an insulating surface, a first photolithography step is performed, so that a gate electrode layer 111 is formed. Alternatively, the gate electrode layer 111 may be formed by processing the conductive film with use of a resist mask formed by an inkjet method. In the case of forming a resist mask by an inkjet method, the manufacturing cost can be reduced because a photomask is not used.

Although there is no particular limitation on a substrate that can be used as the substrate 100 having an insulating surface, it is necessary that the substrate 100 having an insulating surface have at least enough heat resistance to heat treatment to be performed later. As the substrate 100 having an insulating surface, a glass substrate such as a barium borosilicate glass substrate or an aluminoborosilicate glass substrate can be used.

As the glass substrate, a glass substrate formed using a material such as aluminosilicate glass, aluminoborosilicate glass, or barium borosilicate glass may be used. In the case where the temperature at which the heat treatment is performed later is high, it is preferable to use a glass substrate whose strain point is higher than or equal to 730° C. Note that more practical glass with heat resistance can be obtained when it contains a larger amount of barium oxide (BaO) than diboron trioxide ($B_2O_3$). Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used instead of the glass substrate. A crystallized glass substrate or the like may also be used.

An insulating film serving as a base film may be provided between the substrate 100 and the gate electrode layer 111. The base film has a function of preventing diffusion of an impurity element from the substrate 100, and can be formed to have a single-layer structure or stacked-layer structure using one or more of a silicon nitride film, a silicon oxide film, a silicon nitride oxide film, and a silicon oxynitride film.

The gate electrode layer 111 can be formed to have a single-layer structure or a stacked-layer structure using one or more of metal materials such as Mo, Ti, Cr, Ta, W, Al, Cu, Nd and Sc, and alloy materials containing the above metal material as its main component. In the case where the gate electrode layer 111 has a two-layer structure, a preferable structure is, for example, a structure in which a Mo layer is stacked over an Al layer, a structure in which a Mo layer is stacked over a Cu layer, a structure in which a titanium nitride layer or a tantalum nitride layer is stacked over a Cu layer, a structure in which a titanium nitride layer and a Mo layer are stacked, or a structure in which a tungsten nitride layer and a W layer are stacked. In the case where the gate electrode layer 111 has a three-layer structure, a preferable structure is a structure in which a W layer or a tungsten nitride layer, an Al—Si alloy layer or an Al—Ti alloy layer, and a titanium nitride layer or a Ti layer are stacked.

Then, a gate insulating layer 102 is formed over the gate electrode layer 111.

The gate insulating layer 102 can be formed to have a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed by a plasma CVD method using a $SiH_4$ gas, an oxygen gas, and a nitrogen gas as a source gas. The thickness of the gate insulating layer 102 is preferably more than or equal to 100 nm and less than or equal to 500 nm. In the case where the gate insulating layer 102 has a stacked-layer structure of a plurality of insulating layers, a stack of a first gate insulating layer having a thickness of more than or equal to 50 nm and less than or equal to 200 nm and a second gate insulating layer having a thickness of more than or equal to 5 nm and less than or equal to 300 nm over the first gate insulating layer may be used. The total thickness of the gate insulating layer 102, even in the case of a stacked-layer structure of a plurality of insulating layers, is preferably more than or equal to 100 nm and less than or equal to 500 nm.

In this embodiment, a silicon oxynitride layer having a thickness of less than or equal to 100 nm is formed by a plasma CVD method as the gate insulating layer 102.

Next, an oxide semiconductor film 130 having a thickness of more than or equal to 2 nm and less than or equal to 200 nm is formed over the gate insulating layer 102.

Note that before the oxide semiconductor film 130 is formed by a sputtering method, dust attached to a surface of the gate insulating layer 102 is preferably removed by reverse sputtering in which plasma is generated in an argon gas atmosphere. Note that nitrogen, helium, oxygen, or the like may be used instead of the argon atmosphere.

The oxide semiconductor film 130 is formed using: a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, or an In—Sn—O-based metal oxide; an In—O-based metal oxide, a Sn—O-based metal oxide, or a Zn—O-based metal oxide. In this embodiment, the oxide semiconductor film 130 is formed by a sputtering method with use of an In—Ga—Zn—O-based oxide semiconductor target. FIG. 1A is a cross-sectional view at this stage. The oxide semiconductor film 130 can be formed by a sputtering method in a rare gas (e.g., argon) atmosphere, an oxygen gas atmosphere, or a mixed gas atmosphere including a rare gas (e.g., argon) and oxygen. In the case of using a sputtering method, a target including $SiO_2$ at more than or equal to 2 wt % and less than or equal to 10 wt % may be used.

As a target for forming the oxide semiconductor film 130 by a sputtering method, for example, a metal oxide target containing zinc oxide as its main component can be used. As another example of a metal oxide target, an oxide semiconductor target containing In, Ga, and Zn (in a composition ratio, $In_2O_3:Ga_2O_3:ZnO=1:1:1$ [mol ratio], or In:Ga:Zn=1:1:0.5 [atomic ratio]) can be used. As an oxide semiconductor target containing In, Ga, and Zn (in a composition ratio, In:Ga:Zn=1:1:1 [atomic ratio], or In:Ga:Zn=1:1:2 [atomic ratio]) can also be used. The fill rate of the oxide semiconductor target is more than or equal to 90% and less than or equal to 100%, preferably, more than or equal to 95% and less than or equal to 99.9%. With the use of the oxide semiconductor target with high fill rate, a dense oxide semiconductor film is formed.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the oxide semiconductor film 130 is formed. Note that the sputtering gas means a gas which is introduced into a treatment chamber where sputtering is performed.

First, the substrate is held inside a treatment chamber which is kept in a reduced pressure state, and the substrate is heated to a temperature of more than or equal to 100° C. and less than or equal to 600° C. (preferably, more than or equal to 200° C. and less than or equal to 400° C.). By forming the oxide semiconductor film in the state where the substrate is heated, the concentration of impurities in the oxide semiconductor film formed and damage caused by sputtering can be reduced. Then, a sputtering gas from which hydrogen and moisture are removed is introduced into the treatment chamber, and an oxide semiconductor film is formed over the substrate with use of a metal oxide as a target in the state where moisture remaining in the treatment chamber is removed. An entrapment vacuum pump is preferably used for evacuating the treatment chamber. For example, a cryopump, an ion pump, or a titanium sublimation pump is preferably used. The evacuation unit may be a turbo pump provided with a cold trap. For example, a hydrogen atom, a compound containing a hydrogen atom such as water, a compound containing a carbon atom, and the like are removed from the treatment chamber which is evacuated with the cryopump; as a result, the concentration of impurities in the oxide semiconductor film formed in the treatment chamber can be reduced.

The oxide semiconductor film is formed, for example, under conditions where the distance between the substrate and the target is 100 mm, the pressure in the treatment chamber is 0.6 Pa, the direct current (DC) power supply is 0.5 kW, and the atmosphere is oxygen (the proportion of the oxygen flow is 100%). Note that a pulsed direct current (DC) power supply is preferably used because generation of powder substances (also referred to as particles or dust) in film formation can be suppressed and the film thickness can be uniform. Although the thickness of the oxide semiconductor film is preferably more than or equal to 5 nm and less than or equal to 30 nm, the thickness may be determined as appropriate depending on the oxide semiconductor material without limitation.

Then, a second photolithography step is performed, so that the oxide semiconductor film 130 is processed into an island-shaped oxide semiconductor layer. Alternatively, the island-shaped oxide semiconductor layer may be formed by processing the oxide semiconductor film 130 with use of a resist mask formed by an inkjet method. In the case of forming a resist mask by an inkjet method, the manufacturing cost can be reduced because a photomask is not used.

Figure 1B:
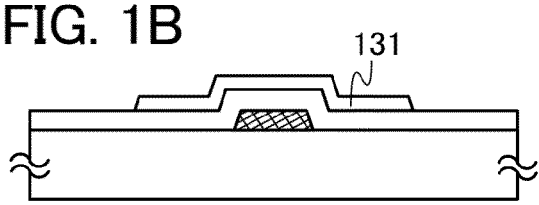

Next, the oxide semiconductor layer is subjected to first heat treatment. With the first heat treatment, dehydration or dehydrogenation of the oxide semiconductor layer can be conducted. The temperature of the first heat treatment is more than or equal to 400° C. and less than or equal to 750° C., preferably more than or equal to 400° C. and less than the strain point of the substrate. Here, the substrate 100 is transferred into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 131 is obtained (FIG. 1B).

The heat treatment apparatus is not limited to the above-described electric furnace but may be a heat treatment apparatus provided with a unit that heats an object to be processed by thermal conduction or thermal radiation from a heater such as a resistance heater or the like. For example, an RTA (rapid thermal anneal) apparatus such as a GRTA (gas rapid thermal anneal) apparatus or an LRTA (lamp rapid thermal anneal) apparatus can be used. Note that the GRTA apparatus is a heat treatment apparatus using a high-temperature gas. As the high-temperature gas, an inert gas which is unlikely to react with an object to be processed by heat treatment, such as nitrogen gas or a rare gas like argon, is used. The LRTA apparatus is a heat treatment apparatus for heating the object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp.

For example, as the first heat treatment, GRTA may be performed as follows. The substrate is transferred into a treatment chamber filled with a high-temperature gas at a temperature of 650° C. to 700° C., subjected to the high-temperature gas for several minutes, and taken out from the treatment chamber. Such GRTA enables heat treatment for a short time.

Note that it is preferable that in the first heat treatment, nitrogen or a rare gas such as helium, neon, or argon, which is a gas introduced into the treatment chamber does not contain water, hydrogen, and the like. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is less than or equal to 1 ppm, preferably less than or equal to 0.1 ppm).

There is a case where the oxide semiconductor layer is crystallized to be a microcrystalline film or a polycrystalline film depending on conditions of the first heat treatment or materials of the oxide semiconductor layer. For example, the oxide semiconductor layer may be crystallized into a microcrystalline oxide semiconductor film having a degree of crystallization of more than or equal to 90%, or more than or equal to 80%. There is also a case where the oxide semiconductor layer becomes an amorphous oxide semiconductor film which does not contain crystalline components depending on conditions of the first heat treatment or materials of the oxide semiconductor layer. Alternatively, there is a case where an amorphous film contains mirocrystals (the grain size is more than or equal to 1 nm and less than or equal to 20 nm (e.g., more than or equal to 2 nm and less than or equal to 4 nm)).

The first heat treatment of the oxide semiconductor layer may be performed on the oxide semiconductor film 130 before being processed into the island-shaped oxide semiconductor layer. In that case, after the first heat treatment, the substrate is taken out of the heat treatment apparatus, and then a photolithography step is performed, so that the island-shaped oxide semiconductor layer is formed.

The heat treatment having effects of dehydration or dehydrogenation of the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

In the case where a contact hole is formed in the gate insulating layer 102, the contact hole in the gate insulating layer 102 may be formed before dehydration or dehydrogenation treatment is performed on the oxide semiconductor film 130, or after the dehydration or dehydrogenation treatment is performed.

Next, a conductive film is formed over the gate insulating layer 102 and the oxide semiconductor layer 131. The conductive film may be formed by a sputtering method or a vacuum evaporation method. As a material of the conductive film, an element selected from Al, Cr, Cu, Ta, Ti, Mo, and W; an alloy containing any of these elements as a component; an alloy film containing any of these elements in combination; and the like can be given. In addition, one or more of Mn, Mg, Zr, Be, and Th may also be used. The conductive film may have a single-layer structure or a stacked-layer structure of a plurality of layers. For example, a single-layer structure of an Al film containing Si, a two-layer structure in which a Ti film is stacked over an Al film, a three-layer structure in which an Al film is interposed between two Ti films, or the like can be given. When the conductive film includes an Al film, it may contain Nd or Sc. Note that these films may be nitride films.

Figure 1C:
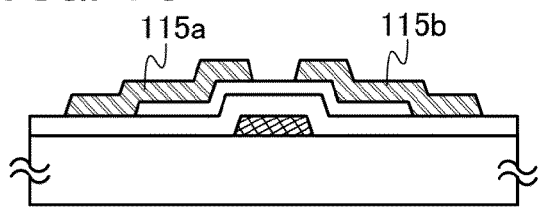

Next, a third photolithography step is performed, so that the conductive film is processed into a source electrode layer 115a and a drain electrode layer 115b. After that, a resist mask is removed (FIG. 1C).

KrF laser light or ArF laser light is preferably used for light exposure for forming the resist mask in the third photolithography step. Channel length L of a transistor to be formed later is determined by a space between the source electrode layer and the drain electrode layer, which are adjacent to each other over the oxide semiconductor layer 131. Note that in the case where light exposure is performed so that the channel length L becomes less than 25 nm, light exposure for forming the resist mask in the third photolithography step is performed using extreme ultraviolet with an extremely short wavelength of several nanometers to several tens of nanometers. Light exposure using extreme ultraviolet enables high resolution and deep depth of focus. Thus, the channel length L of the transistor to be formed later can be more than or equal to 10 nm and less than or equal to 1000 nm and the operation speed of a circuit can be increased, and furthermore the value of off-state current is extremely small, and thus lower power consumption can be achieved.

Note that each material and etching conditions need to be adjusted as appropriate so that the oxide semiconductor layer 131 is not removed in etching of the conductive film.

In this embodiment, a Ti film is used as the conductive film, and an In—Ga—Zn—O-based oxide semiconductor is used for the oxide semiconductor layer 131. As an etchant, an ammonia hydrogen peroxide mixture (a mixed solution of ammonia, water, and a hydrogen peroxide solution) is used.

In the third photolithography step, only part of the oxide semiconductor layer 131 is etched off, and an oxide semiconductor layer having a groove (a depressed portion) is formed in some cases. A resist mask for forming the source electrode layer 115a and the drain electrode layer 115b may be formed by an inkjet method. In the case of forming a resist mask by an inkjet method, the manufacturing cost can be reduced because a photomask is not used.

Further, an oxide conductive layer may be formed between the oxide semiconductor layer 131 and the source electrode layer 115a and between the oxide semiconductor layer 131 and the drain electrode layer 115b. The oxide conductive layer and the conductive layer for forming the source and drain electrode layers can be successively formed. The oxide conductive layer can function as source and drain regions.

By forming the oxide conductive layer between the oxide semiconductor layer and the source and drain electrode layers as the source and drain regions, the source and drain regions can have lower resistance and the transistor can be operated at high speed.

In order to reduce the number of photomasks and steps in the photolithography step, the etching step may be performed using a resist mask formed by a multi-tone mask.

Next, plasma treatment is performed using a dinitrogen monoxide gas, a nitrogen gas, an Ar gas, or the like. Through this plasma treatment, water or the like adsorbed on a surface of the oxide semiconductor layer which is exposed is removed. Alternatively, plasma treatment may be performed using a mixed gas of an oxygen gas and Ar. After the plasma treatment, the insulating oxide layer 116 which serves as a protective insulating film and is in contact with a surface of the exposed oxide semiconductor layer is formed without exposure to the air.

The insulating oxide layer 116 can be formed to a thickness of more than or equal to 1 nm by a method with which impurities such as water or hydrogen does not enter the insulating oxide layer 116 (e.g., a sputtering method or the like). When hydrogen is contained in the insulating oxide layer 116, entry of the hydrogen to the oxide semiconductor layer or extraction of oxygen in the oxide semiconductor layer by the hydrogen is caused, whereby part of the oxide semiconductor layer that is in contact with the insulating oxide layer 116 comes to be n-type (to have a lower resistance) and thus a parasitic channel might be formed. Therefore, it is important that the insulating oxide layer 116 is formed containing as little hydrogen as possible.

In this embodiment, a 200-nm-thick silicon oxide film is formed by a sputtering method as the insulating oxide layer 116. The substrate temperature in film formation may be more than or equal to room temperature and less than or equal to 300° C., and is 100° C. in this embodiment. The formation of the silicon oxide film by a sputtering method can be performed in a rare gas (e.g., argon) atmosphere, an oxygen gas atmosphere, or an atmosphere of a mixed gas of a rare gas (e.g., argon) and an oxygen gas. Further, a silicon oxide target or a silicon target can be used as a target. For example, with the use of a silicon target, a silicon oxide film can be formed by a sputtering method in a mixed gas atmosphere of an oxygen gas and a nitrogen gas. As the insulating oxide layer 116 which is formed in contact with the oxide semiconductor layer whose resistance is reduced, an inorganic insulating film which does not contain impurities such as moisture, hydrogen ions, and hydroxy groups and blocks entry of these from the outside is used; for example, a silicon oxide film, a silicon nitride oxide film, an aluminum oxide film, an aluminum oxynitride film, or the like is used.

In that case, the insulating oxide layer 116 is preferably formed in the state where moisture remaining in the treatment chamber is removed. This is for preventing hydrogen, hydroxy groups, or moisture from being contained in the oxide semiconductor layer 131 and the insulating oxide layer 116.

As described above, an entrapment vacuum pump is preferably used for evacuating the treatment chamber. The concentration of impurities contained in the insulating oxide layer 116 can be reduced by using the entrapment vacuum pump.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the insulating oxide layer 116 is formed.

Next, second heat treatment is performed. The temperature of the second heat treatment is preferably more than or equal to 200° C. and less than or equal to 400° C., and more preferably more than or equal to 250° C. and less than or equal to 350° C. Note that the second heat treatment may be performed in an inert gas atmosphere or an oxygen gas atmosphere. In this embodiment, heat treatment may be performed in a nitrogen atmosphere at 250° C. for one hour. The second heat treatment is performed in the state where part of the oxide semiconductor layer (a channel formation region) is in contact with the insulating oxide layer 116.

Figure 1D:
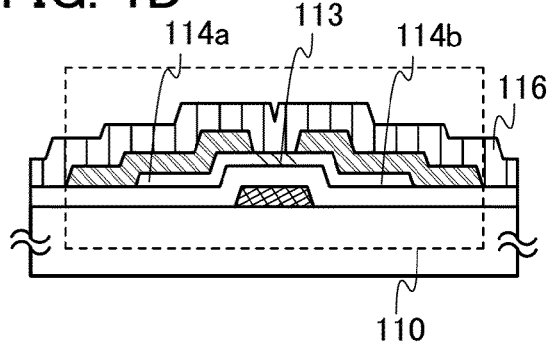

Through the above process, heat treatment for dehydration or dehydrogenation is performed on the deposited oxide semiconductor film to reduce the resistance, and then, part of the oxide semiconductor film is selectively made in an oxygen-excess state. As a result, the channel formation region 113 overlapping with the gate electrode layer 111 becomes an i-type semiconductor having a low conductivity, and a high-resistance source region 114a overlapping with the source electrode layer 115a and a high-resistance drain region 114b overlapping with the drain electrode layer 115b are formed in a self-aligned manner. Through the above process, the transistor 110 is formed (FIG. 1D).

Here, heat treatment may further be performed at more than or equal to 100° C. and less than or equal to 200° C. for more than or equal to 1 hour and less than or equal to 30 hours in the air. In this embodiment, the heat treatment is performed at 150° C. for 10 hours. This heat treatment may be performed at a fixed heating temperature, or may be performed by repeating increasing a temperature from room temperature to a heat temperature of more than or equal to 100° C. and less than or equal to 200° C. and decreasing the temperature from the heat temperature to room temperature plural times. Further, this heat treatment may be performed before formation of the insulating oxide layer under a reduced pressure. When the heat treatment is performed under a reduced pressure, the heating time can be shortened. With this heat treatment, a normally-off transistor can be obtained. In the case of using a silicon oxide layer which contains a large number of defects as the insulating oxide layer, the defects can be reduced by this heat treatment.

By the formation of the high-resistance drain region 114b (or the high-resistance source region 114a) in part of the oxide semiconductor layer, which overlaps with the drain electrode layer 115b (and the source electrode layer 115a), the reliability of the transistor can be improved. Specifically, by forming the high-resistant drain region 114b, it is possible to employ a structure in which conductivity can be gradually varied from the drain electrode layer 115b to the high-resistant drain region 114b and the channel formation region 113. Therefore, in the case where the transistor is operated in the state where the drain electrode layer 115b is connected to a wiring for supplying a high power supply potential Vdd, even when a difference between potentials of the gate electrode layer 111 and the drain electrode layer 115b is large, the high-resistance drain region 114b serves as a buffer, so that the withstand voltage of the transistor can be increased.

In the case where the thickness of the oxide semiconductor layer is less than or equal to 15 nm, the high-resistance source region 114a and the high-resistance drain region 114b are formed entirely in the depth direction; whereas in the case where the thickness of the oxide semiconductor layer more than or equal to 30 nm and less than or equal to 50 nm, the high-resistance source region 114a and the high-resistance drain region 114b are formed in part of the oxide semiconductor layer (a region in contact with the source and drain electrode layers and the vicinity thereof), and a region of the oxide semiconductor layer, which is near the gate insulating film, can become an i-type semiconductor.

Figure 1E:
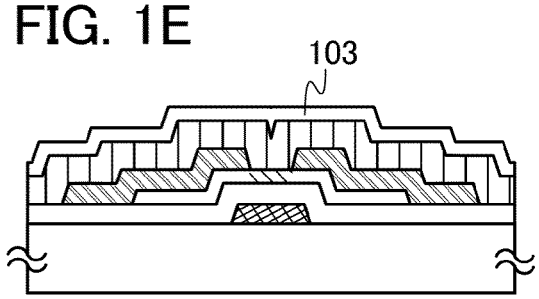

A protective insulating layer may be additionally formed over the insulating oxide layer 116. For example, a silicon nitride film is formed as the protective insulating layer by an RF sputtering method. The RF sputtering method is preferable as a formation method of the protective insulating layer because it achieves high mass productivity. The protective insulating layer is formed using an inorganic insulating film which does not contain impurities such as moisture, hydrogen ions, and hydroxy groups and blocks entry of these from the outside; for example, a silicon nitride film, an aluminum nitride film, a silicon nitride oxide film, an aluminum nitride oxide film, or the like is used. Here, a silicon nitride film is used to form a protective insulating layer 103 (FIG. 1E).

In this embodiment, the substrate 100 over which layers up to and including the insulating oxide layer 116 are formed is transferred into a treatment chamber and heated at a temperature of more than or equal to 100° C. and less than or equal to 400° C., a sputtering gas containing a high-purity nitrogen gas from which hydrogen and moisture are removed is introduced into the treatment chamber, and a silicon nitride film is formed as the protective insulating layer 103 with use of a silicon target. The protective insulating layer 103 is preferably formed in the state where moisture remaining in the treatment chamber is removed, as in formation of the insulating oxide layer 116.

Note that a planarization insulating layer for planarization may be provided over the protective insulating layer 103.

Figure 1F:
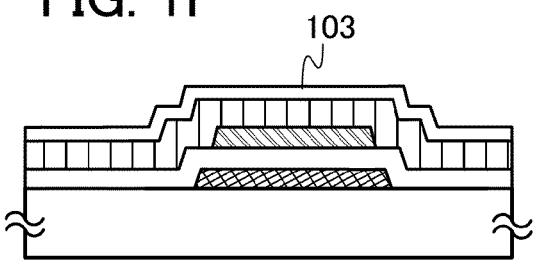
FIG. 1F illustrates a capacitor which is one embodiment of the present invention.
Figure 2:
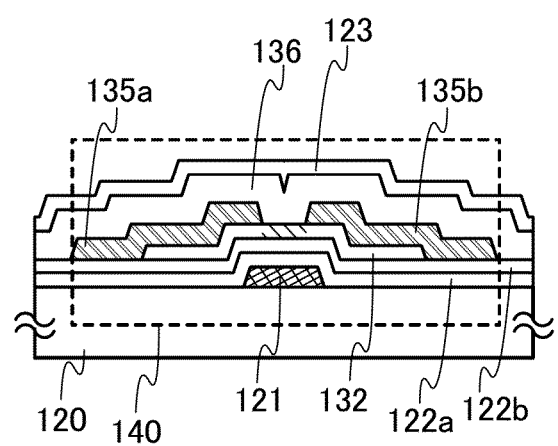
FIG. 2 illustrates a transistor which is one embodiment of the present invention.

In the manner described above with reference to FIGS. 1A to 1E, the semiconductor device of this embodiment can be manufactured. Note that a capacitor can also be formed in the above process. The capacitor is formed with the gate electrode layer 111, an electrode layer that is formed using the same material as the source electrode layer 115a (and the drain electrode layer 115b), and the gate insulating layer 102. The gate insulating layer 102 is provided between the gate electrode layer 111 and the electrode layer (see FIG. 1F). Note also that in the case where another transistor in this specification is formed, the capacitor may be formed with a gate electrode layer, an electrode layer that is formed using the same material as a source electrode layer, and a gate insulating layer between the gate electrode layer and the electrode layer that is formed using the same material as the source electrode layer. Note that the semiconductor device of this embodiment is not limited to this mode, and a mode illustrated in FIG. 2 may also be employed. FIG. 2 illustrates a transistor 140.

In manufacture of the transistor 140 illustrated in FIG. 2, first, a gate electrode layer 121 is formed over a substrate 120, a first gate insulating layer 122a is formed, and the second gate insulating layer 122b is formed so as to be stacked thereover. In this embodiment, the gate insulating layer has a two-layer stacked structure; the first gate insulating layer 122a is formed using an insulating nitride layer, and the second gate insulating layer 122b is formed using an insulating oxide layer.

The insulating oxide layer can be formed using a silicon oxide layer, a silicon oxynitride layer, an aluminum oxide layer, an aluminum oxynitride layer, or the like. The insulating nitride layer can be formed using a silicon nitride layer, a silicon nitride oxide layer, an aluminum nitride layer, an aluminum nitride oxide layer, or the like.

In this embodiment, a structure in which a silicon nitride layer and a silicon oxide layer are stacked in this order over the gate electrode layer 121 is employed. The gate insulating layer (in this embodiment, the thickness is 150 nm) is formed by forming a silicon nitride layer ($SiN_y$ ($y>0$)) as the first gate insulating layer 122a by a sputtering method to a thickness of more than or equal to 50 nm and less than or equal to 200 nm (in this embodiment, the thickness is 50 nm), and a silicon oxide layer ($SiO_x$ ($x>0$)) as the second gate insulating layer 122b by a sputtering method to a thickness of more than or equal to 5 nm and less than or equal to 300 nm (in this embodiment, the thickness is 100 nm) over the first gate insulating layer 122a.

Next, an oxide semiconductor film is formed over the gate insulating layer, and a photolithography step is performed, so that the oxide semiconductor film is processed into an island-shaped oxide semiconductor layer. In this embodiment, the oxide semiconductor film is formed by a sputtering method with use of an In—Ga—Zn—O-based oxide semiconductor target.

The oxide semiconductor film is preferably formed in the state where moisture remaining in the treatment chamber is removed. This is for preventing hydrogen, hydroxy groups, or moisture from being contained in the oxide semiconductor film. Note that an entrapment vacuum pump is preferably used for evacuating the treatment chamber.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the oxide semiconductor film is formed.

Next, first heat treatment is performed, so that dehydration or dehydrogenation of the oxide semiconductor layer is conducted. The temperature of the first heat treatment is more than or equal to 400° C. and less than or equal to 750° C., preferably more than or equal to 400° C. and less than the strain point of the substrate. Note that in the case where the temperature is more than or equal to 425° C., the heat treatment time may be less than or equal to one hour, whereas in the case where the temperature is less than 425° C., the heat treatment time is preferably more than one hour. Here, the substrate is transferred into an electric furnace which is one of heat treatment apparatuses, heat treatment is performed on the oxide semiconductor layer in a nitrogen atmosphere, and then, the oxide semiconductor layer is not exposed to the air so that entry of water and hydrogen into the oxide semiconductor layer is prevented; thus, an oxide semiconductor layer is obtained. After that, a high-purity oxygen gas, a high-purity $N_2O$ gas, or an ultra-dry air (having a dew point of lower than or equal to −40° C., preferably lower than or equal to −60° C.) is introduced into the same furnace, and cooling is performed. It is preferable that the oxygen gas or the $N_2O$ gas do not contain water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the $N_2O$ gas is less than or equal to 1 ppm, preferably less than or equal to 0.1 ppm).

The heat treatment apparatus used here is not limited to the electric furnace but may be a heat treatment apparatus provided with a unit that heats an object to be processed by thermal conduction or thermal radiation from a heater such as a resistance heater or the like. For example, an RTA apparatus such as a GRTA apparatus or an LRTA apparatus may be used. In this embodiment, the heat treatment is performed at 600° C. to 750° C. for several minutes using an RTA method.

Further, after the first heat treatment for dehydration or dehydrogenation, heat treatment may be performed at more than or equal to 200° C. and less than or equal to 400° C., preferably more than or equal to 200° C. and less than or equal to 300° C., in an atmosphere of an oxygen gas or an $N_2O$ gas.

The first heat treatment of the oxide semiconductor layer can be performed on the oxide semiconductor film before being processed into the island-shaped oxide semiconductor layer. In that case, after the first heat treatment, the substrate is taken out of the heat treatment apparatus, and then a photolithography step is performed.

Through the above process, the entire region of the oxide semiconductor film is made in an oxygen-excess state, thereby having higher resistance (becoming an i-type semiconductor); accordingly, an oxide semiconductor layer 132 whose entire region is an i-type semiconductor is obtained.

Next, a conductive film is formed over the second gate insulating layer 122b and the oxide semiconductor layer 132. A photolithography step is performed and a resist mask is formed over the conductive film, and selective etching is performed, so that the source electrode layer 135a and the drain electrode layer 135b are formed. Then, the resist mask is removed. After that, an insulating oxide layer 136 is formed by a sputtering method.

Note that the insulating oxide layer 136 is preferably formed in the state where moisture remaining in the treatment chamber is removed. This is for preventing hydrogen, hydroxy groups, or moisture from being contained in the oxide semiconductor layer 132 and the insulating oxide layer 136. An entrapment vacuum pump is preferably used for evacuating the treatment chamber.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the insulating oxide layer 136 is formed.

Next, in order to reduce variation in electric characteristics of the transistor on the substrate, heat treatment (preferably at more than or equal to 150° C. and less than 350° C.) may be performed in an inert gas atmosphere or a nitrogen gas atmosphere. In this embodiment, the heat treatment is performed in a nitrogen atmosphere at 250° C. for one hour.

In addition, heat treatment may be performed at more than or equal to 100° C. and less than or equal to 200° C. for more than or equal to 1 hour and less than or equal to 30 hours in the air. In this embodiment, the heat treatment is performed at 150° C. for 10 hours. This heat treatment may be performed at a fixed heating temperature, or may be performed by repeating increasing a temperature from room temperature to a heat temperature of more than or equal to 100° C. and less than or equal to 200° C. and decreasing the temperature from the heat temperature to room temperature plural times. Further, this heat treatment may be performed before formation of the insulating oxide layer under a reduced pressure. When the heat treatment is performed under a reduced pressure, the heating time can be shortened. With this heat treatment, a normally-off transistor can be obtained.

Next, a protective insulating layer 123 is formed over the insulating oxide layer 136. Here, a 100-nm-thick silicon nitride film is formed as the protective insulating layer 123 by a sputtering method.

By forming the protective insulating layer 123 and the first gate insulating layer 122a using insulating nitride layers, it is possible that these layers do not contain impurities such as moisture, hydrogen, hydrides, and hydroxides, and block entry of these from the outside.

Thus, in this manufacturing process, entry of moisture and the like from the outside can be prevented. Further, even after a device is completed as a semiconductor device such as a liquid crystal display device, entry of impurities such as moisture from the outside can be prevented in the long term; therefore, the long-term reliability of the device can be improved.

Further, part of the insulating layers between the protective insulating layer 123 formed using an insulating nitride layer and the first gate insulating layer 122a may be removed so that the protective insulating layer 123 and the first gate insulating layer 122a are in contact with each other.

A planarization insulating layer for planarization may be provided over the protective insulating layer 123.

In the manner described above with reference to FIG. 2, the semiconductor device of this embodiment can be manufactured.

Note that the temperature of the heat treatment in this embodiment is not limited to the temperatures described above. As described below, the temperature of the heat treatment may be less than 400° C.

A substrate over which a gate electrode layer is formed or a substrate over which the layers up to and including the gate insulating layer are formed is preferably preheated in a preheat chamber of a sputtering apparatus as pretreatment, and impurities such as hydrogen or moisture adsorbed on the substrate are preferably eliminated and evacuated, in order that the gate insulating layer and the oxide semiconductor film contain as little hydrogen, hydroxy groups, and moisture as possible. The temperature of the preheating is more than or equal to 100° C. and less than 400° C. (preferably more than or equal to 150° C. and less than or equal to 300° C.). The preheat chamber is preferably provided with a cryopump and evacuated with the cryopump. Note that this pretreatment of preheating may be performed on the substrate over which the layers up to and including the source and drain electrode layers are formed before formation of the insulating oxide layer, in a similar manner.

The above pretreatment can be performed in manufacture of a liquid crystal display panel, an electroluminescence display panel, and a backplane (a substrate over which a transistor is formed) of a display device using electronic ink. The above pretreatment is performed at a temperature of less than 400° C.; therefore, it can be applied to a manufacturing process in which a glass substrate having a thickness of less than or equal to 1 mm and having a side that is longer than 1 m is used. All the above steps can be performed at a temperature of less than 400° C.; thus, a large amount of energy is not needed for manufacturing a display panel.

Although a sputtering method is used for formation of the gate insulating layer in manufacture of the above-described transistor, the method for formation of the gate insulating layer is not limited to the method described above. For example, a high-density plasma CVD method using a microwave (2.45 GHz) may also be used.

Next, measured values of off-state current using a test element group (also referred to as a TEG) over which the above-described transistor is formed are described below.

Figure 3:
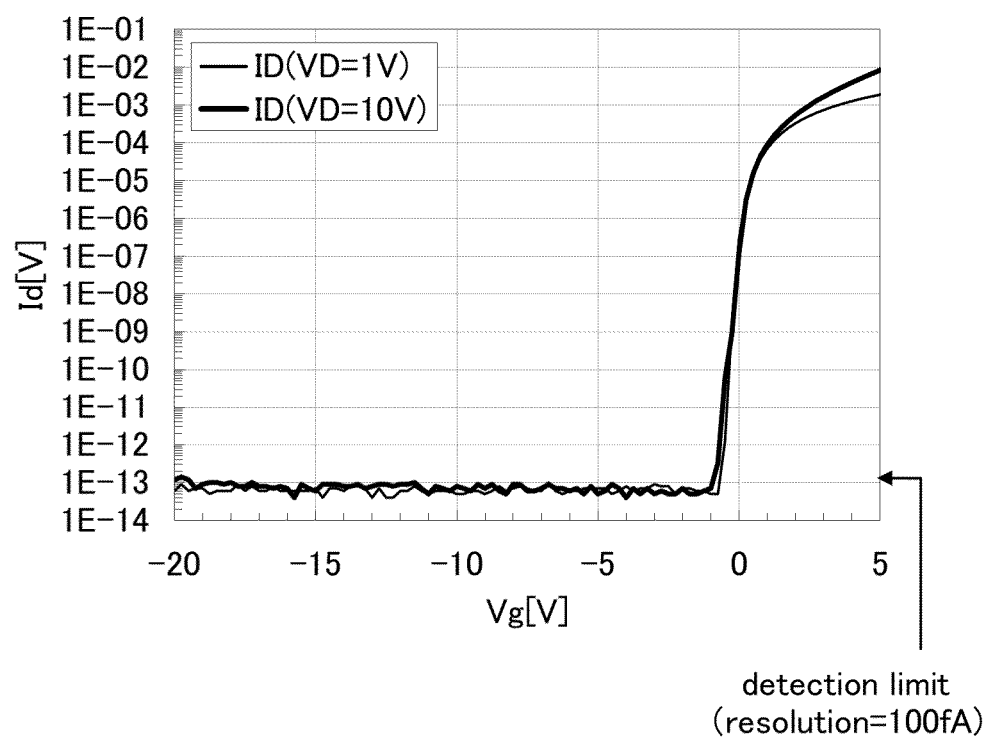
FIG. 3 shows initial properties of a transistor which is one embodiment of the present invention.
Figure 4A:
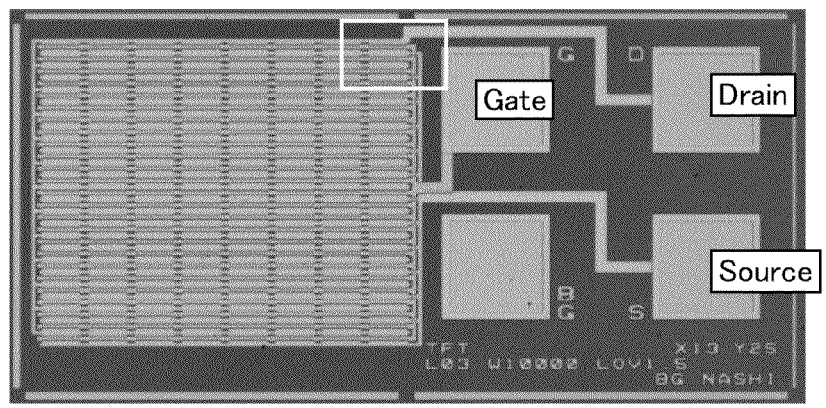
FIGS. 4A and 4B each show a transistor which is one embodiment of the present invention.
Figure 4B:
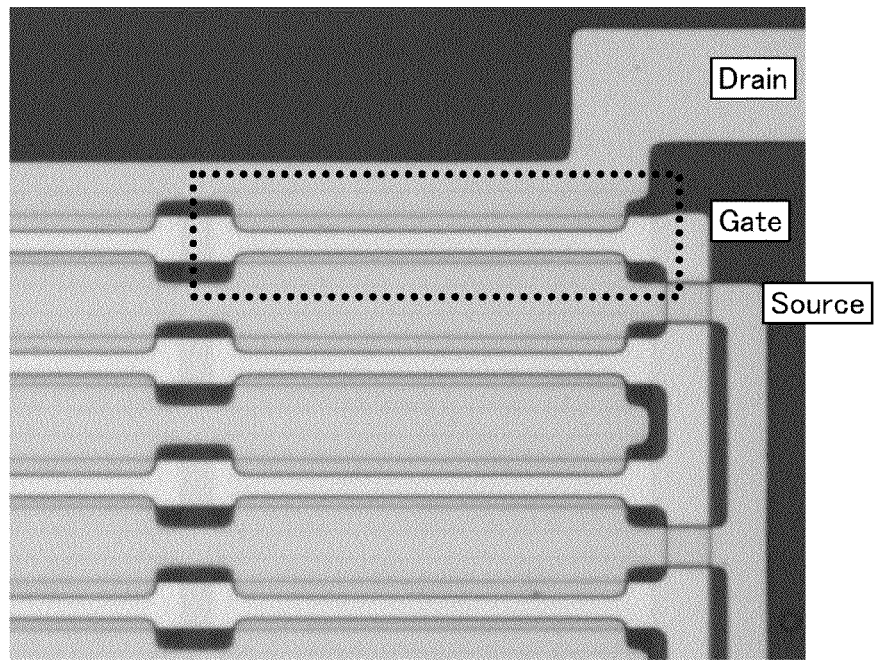

FIG. 4A shows a top view in which 200 transistors each with L/W=3 µm/50 µm (which are virtually identical to a transistor with L/W=3 µm/10000 µm) are connected in parallel. FIG. 4B shows a partially enlarged top view thereof. The region enclosed by a dotted line in FIG. 4B is a transistor with L/W=3 µm/50 µm and Lov=1.5 µm. In measurement, the substrate temperature was set to room temperature. FIG. 3 shows $V_g$-$I_d$ curves as transfer characteristics of the source-drain current (a drain current $I_d$) when the voltage between source and drain (a drain voltage $V_d$) was set to 1 V or 10 V, and the voltage between source and gate (a gate voltage $V_g$) was varied from −20 V to +20 V. Note that FIG. 3 shows $V_g$ in the range of from −20 V to +5 V.

As shown in FIG. 3, the off-state current is less than or equal to $1 \times 10^{-13}$ [A] at $V_d$ of 1 V and 10 V. This value is less than or equal to the resolution (100 fA) of a measurement device (a semiconductor parameter analyzer, Agilent 4156C manufactured by Agilent Technologies Inc.). A method for manufacturing such a film transistor with an extremely low off-state current is described below.

First, a silicon nitride layer was formed as a base layer over a glass substrate by a CVD method, and a silicon oxynitride layer was formed over the silicon nitride layer. A tungsten film was formed as a gate electrode layer over the silicon oxynitride layer by a sputtering method. Here, the gate electrode layer was formed by selectively etching the tungsten film.

Then, a silicon oxynitride layer having a thickness of 100 nm was formed as a gate insulating layer over the gate electrode layer by a CVD method.

Then, an oxide semiconductor film having a thickness of 50 nm was formed over the gate insulating layer by a sputtering method using an In—Ga—Zn—O-based oxide semiconductor target ($In_2O_3$:$Ga_2O_3$:ZnO=1:1:2 [mol ratio]). Here, an island-shaped oxide semiconductor layer was formed by selectively etching the oxide semiconductor film.

Then, heat treatment was performed on the oxide semiconductor layer in a nitrogen atmosphere with use of a clean oven at 450° C. for 1 hour (first heat treatment).

Then, a titanium layer (having a thickness of 150 nm) was formed as a source electrode layer and a drain electrode layer over the oxide semiconductor layer by a sputtering method. Here, the source electrode layer and the drain electrode layer were formed by selective etching such that 200 transistors each having a channel length L of 3 µm and a channel width W of 50 µm were connected in parallel to obtain a transistor virtually with L/W=3 µm/10000 µm.

Then, a silicon oxide layer having a thickness of 300 nm was formed as a protective insulating layer in contact with the oxide semiconductor layer by a reactive sputtering method. Then, openings were formed over the gate electrode layer, the source electrode layer, and the drain electrode layer by selectively etching the silicon oxide layer. After that, heat treatment was performed in a nitrogen atmosphere at 250° C. for 1 hour (second heat treatment). Then, heat treatment was performed in an inert gas atmosphere at 150° C. for 10 hours before the measurement of $V_g$-$I_d$ characteristics. Through the above process, an inverted staggered transistor having a bottom-gate structure was manufactured.

The reason why the transistor has an extremely small off-state current, which is less than or equal to $1 \times 10^{-13}$ [A] as shown in FIG. 3, is that the concentration of hydrogen in the oxide semiconductor layer was able to be sufficiently reduced in the above manufacturing process. The concentration of hydrogen in the oxide semiconductor layer is less than or equal to $5 \times 10^{19}$ cm$^{-3}$, preferably less than or equal to $5 \times 10^{18}$ cm$^{-3}$, still preferably less than or equal to $5 \times 10^{17}$ cm$^{-3}$. Note that the concentration of hydrogen in the oxide semiconductor layer may be measured by secondary ion mass spectroscopy (SIMS).

Although the example of using an In—Ga—Zn—O-based oxide semiconductor is described here, this embodiment is not particularly limited thereto. Another oxide semiconductor material such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. Furthermore, as an oxide semiconductor material, an In—Al—Zn—O-based oxide semiconductor mixed with $AlO_x$ of 2.5 wt % to 10 wt % or an In—Zn—O-based oxide semiconductor mixed with $SiO_x$ of 2.5 wt % to 10 wt % can be used.

The carrier concentration of the oxide semiconductor layer is less than or equal to $5 \times 10^{14}$ cm$^{-3}$, preferably less than or equal to $5 \times 10^{12}$ cm$^{-3}$, more preferably less than or equal to $1.45 \times 10^{10}$ cm$^{-3}$. That is, the carrier concentration of the oxide semiconductor layer can be made as close to zero as possible.

The channel length L of a transistor can be more than or equal to 10 nm and less than or equal to 1000 nm.

In circuit design, the oxide semiconductor layer can be regarded as an insulator when the transistor is in an off state.

After that, the temperature dependence of off-state current of the transistor was evaluated, and the results are shown. Temperature dependence is important in considering the environmental resistance, maintenance of performance, or the like of an end product in which the transistor is used. It is to be understood that smaller temperature dependence of off-state current is more preferable, which increases the degree of freedom for product designing.

Substrates over which transistors were formed were kept at a certain temperature by using a constant-temperature bath, the drain voltage was 6V, and the gate voltage was varied from −20 V to +20 V; thus, $V_g$-$I_d$ curves were obtained to examine the temperature dependence. In this embodiment, the temperatures held by the constant-temperature bath were −30° C., 0° C., 25° C., 40° C., 60° C., 80° C., 100° C., and 120° C.

Figure 5A:
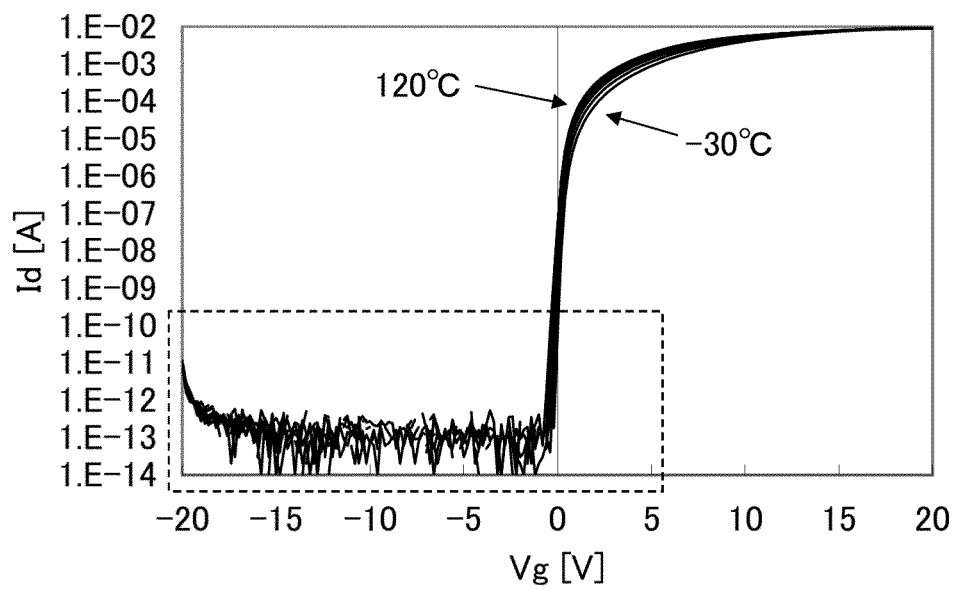
FIGS. 5A and 5B each show $V_g$-$I_d$ characteristics of a transistor which is one embodiment of the present invention.
Figure 5B:
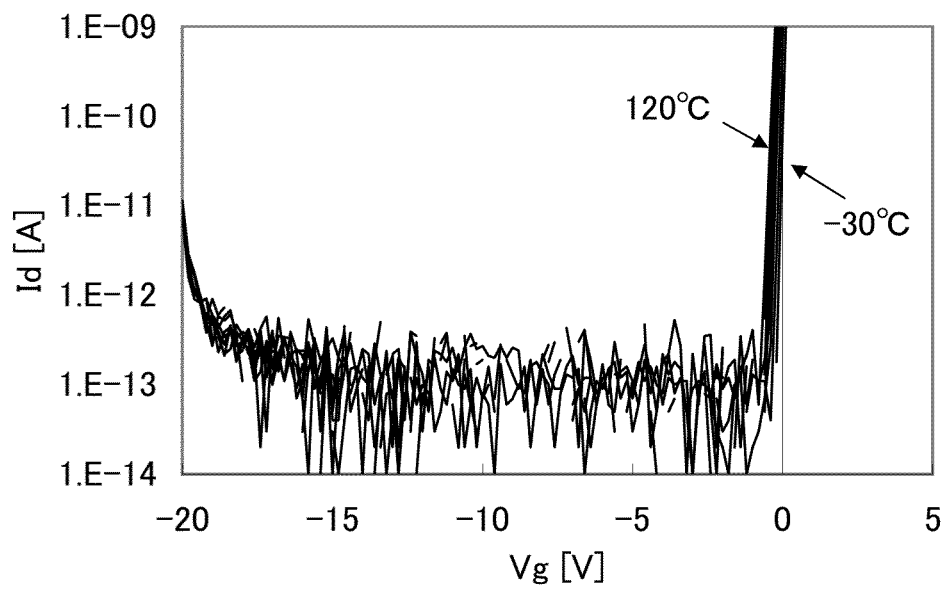

FIG. 5A shows $V_g$-$I_d$ curves measured at the above temperatures, and FIG. 5B shows an enlarged view of the portion surrounded by the dotted line in FIG. 5A. The curve indicated by the right arrow is a curve measured at −30° C., and the curve indicated by the left arrow is a curve measured at 120° C. The other curves measured at the other temperatures are positioned therebetween. There is almost no temperature dependence of on-state current. The off-state current is less than or equal to $1 \times 10^{-12}$ [A], which is close to the resolution of the measurement apparatus, until the gate voltage is lowered to about −20 V at each temperature; therefore, there is almost no temperature dependence. That is, it is found that the off-state current of this transistor is extremely small in view of the off-state current kept less than or equal to $1 \times 10^{-12}$ [A] and a channel width W of 10000 µm even at a high temperature of 120° C.

A transistor including a highly-purified oxide semiconductor (purified OS) shows almost no temperature dependence of off-state current. Because the oxide semiconductor is highly purified, the conductivity becomes as close to that of an intrinsic semiconductor as possible, and the Fermi level is located at the center of a forbidden band; as a result, temperature dependence is not seen. This also results from the fact that the oxide semiconductor has an energy gap of 3 eV or more and includes very few thermally excited carriers. In addition, the source region and the drain region are in a degenerated state, which is also a factor for showing no temperature dependence. The transistor is mainly operated with carriers which are injected from the degenerated source region to the oxide semiconductor, and the above characteristics (no temperature dependence of off-state current) can be explained by no temperature dependence of carrier density.

In the case where a memory circuit (a memory element) or the like is manufactured using a transistor having such an extremely small value of off-state current, the off-state current has a small value and there is very little leakage. Therefore, memory data can be held for a longer period of time.

Next, a semiconductor device to which the above-described transistor is applied is described.

Figure 6:
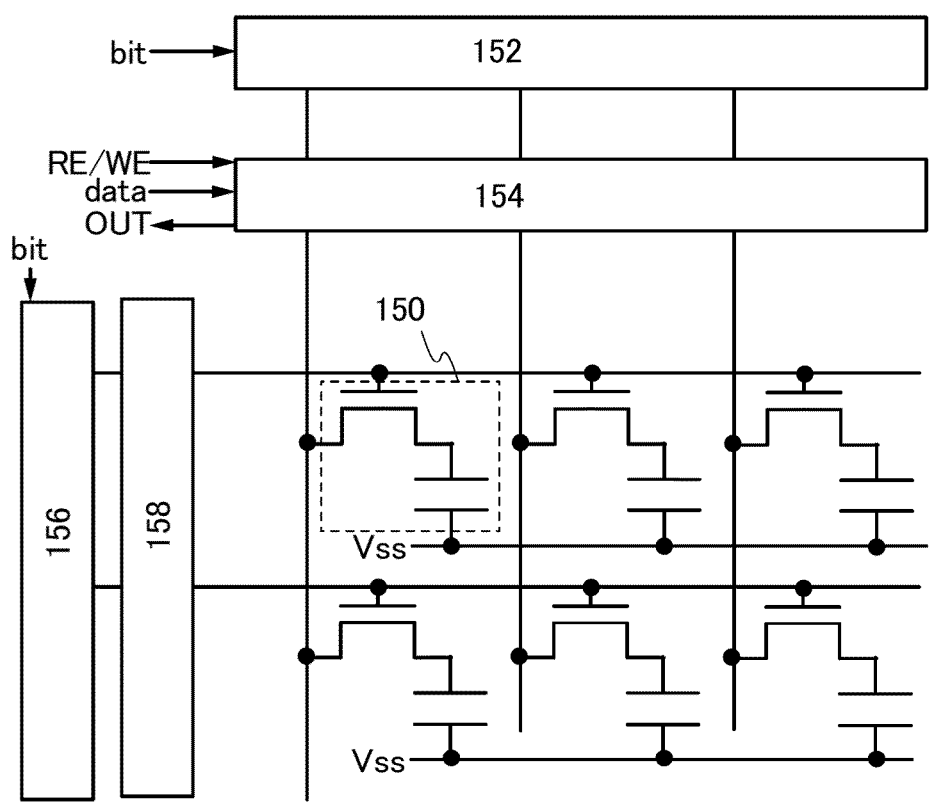
FIG. 6 illustrates a memory circuit (a DRAM) which is one embodiment of the present invention.

FIG. 6 illustrates an example of a block diagram of a memory circuit. The memory circuit illustrated in FIG. 6 includes a row decoder 152, a writing and refresh circuit 154, a column decoder 156, a writing and refresh circuit 158, and a plurality of memory elements 150 arranged in matrix. A signal line connected to the memory elements 150 arranged in matrix is connected to the row decoder 152 through the writing and refresh circuit 154, and a scan line connected to the memory elements 150 arranged in matrix is connected to the column decoder 156 through the writing and refresh circuit 158. A bit signal is input to the row decoder 152. A read enable signal and a write enable signal (RE/WE), a data signal (data), and an output signal (OUT) are input to the writing and refresh circuit 154 and output from the writing and refresh circuit 154.

Each of the memory elements 150 includes a capacitor and a transistor. One of a source and a drain of the transistor is connected to the signal line, and the other of the source and the drain of the transistor is connected to one electrode of the capacitor, and the other electrode of the capacitor is connected to a wiring of the low potential side (preferably, a reference potential Vss).

Figure 7:
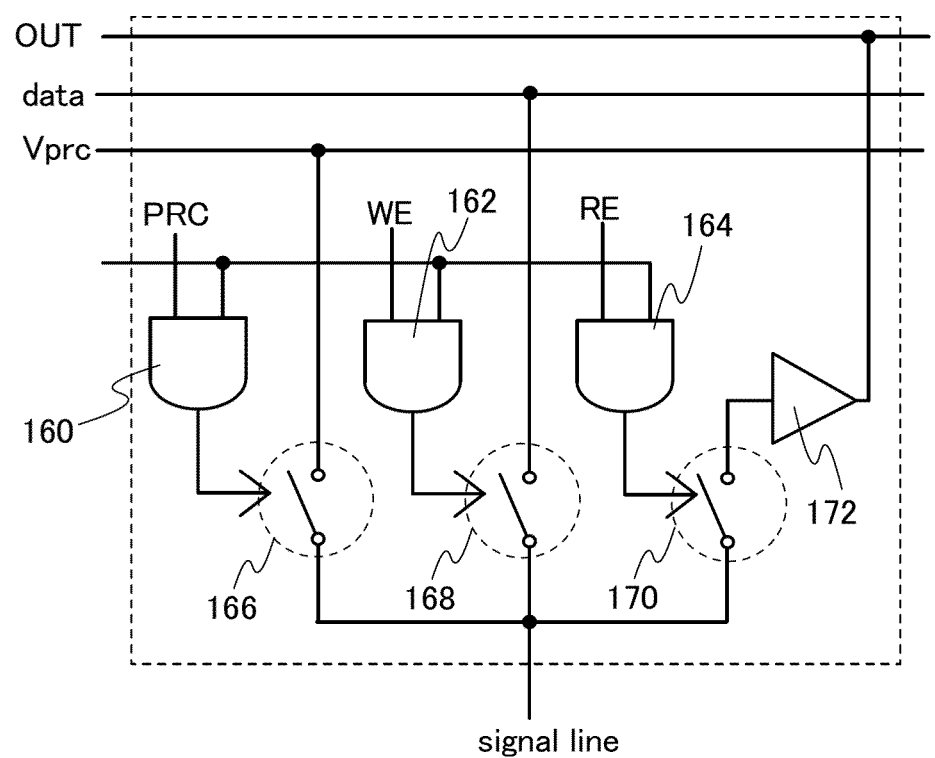
FIG. 7 illustrates a refresh circuit of a memory circuit which is one embodiment of the present invention.

FIG. 7 illustrates a specific example of the refresh circuit that can be provided in the writing and refresh circuit 154 illustrated in FIG. 6. Note that the writing and refresh circuit 158 can be formed to have a similar structure.

The writing and refresh circuit illustrated in FIG. 7 includes a logical conjunction circuit (an AND circuit) and a sense amplifier 172. To one input of each of a first AND circuit 160, a second AND circuit 162, and a third AND circuit 164, a signal is input from the row decoder 152. A PRC signal is input to the other input of the first AND circuit 160, the write enable signal (WE) is input to the other input of the second AND circuit 162, and the read enable signal (RE) is input to the other input of the third AND circuit 164. The output of the first AND circuit 160 controls on/off of a first switch 166, the output of the second AND circuit 162 controls on/off of a second switch 168, and the output of the third AND circuit 164 controls on/off of a third switch 170. A pre-charge signal line Vprc is connected to the signal line through the first switch 166, and a data signal line (data) is connected to the signal line through the second switch 168.

The signal line connected through the first switch 166 and the second switch 168 are connected to the sense amplifier 172 through the third switch 170. A signal is output to the output signal line (OUT) from the sense amplifier 172.

Note that the above AND circuit may have a general structure, and preferably has a simple structure.

A sense amplifier is a circuit having a function of amplifying input signals.

Note that as a signal here, an analog signal or a digital signal which uses voltage, current, resistance, frequency, or the like can be used, for example. For example, at least two potentials, that is, a first potential and a second potential are set, a high-level (also referred to as high potential or $V_H$) potential is used as the first potential, and a low-level (also referred to as low potential or $V_L$) potential is used as the second potential, whereby a binary digital signal can be set. Although $V_H$ and $V_L$ are preferably constant values, $V_H$ and $V_L$ may take a wide range of values, in consideration of influence of noise.

Thus, a memory (DRAM) circuit can be manufactured using the above-described transistors.

A refresh timing of the memory circuit may be determined to a certain time interval in the design phase, on the basis of the leakage current of the memory elements 150 which is evaluated in advance. The refresh timing is set in consideration of the temperature dependence of leakage current and variation of the manufacturing process, after the chip of a memory circuit is completed.

The above-described transistors show almost no temperature dependence of off-state current and can keep an extremely small off-state current value. Therefore, when the above-described transistors are used, refresh interval can be set long as compared with a transistor using silicon, and power consumption in a standby period can be reduced.

Note that the memory circuit used here is not limited to the above-described DRAM. For example, the memory element may be an SRAM.

Figure 8:
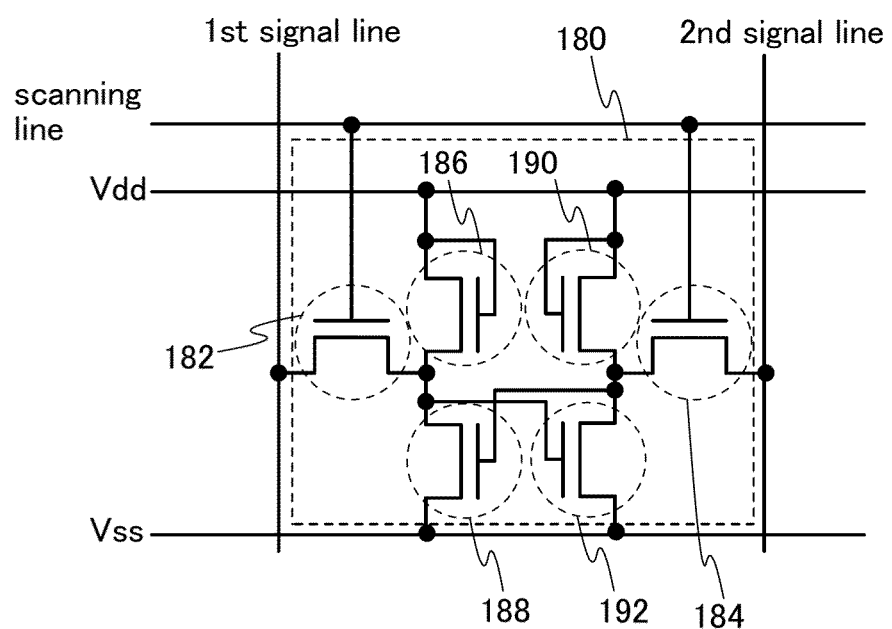
FIG. 8 illustrates a memory circuit (an SRAM) which is one embodiment of the present invention.

FIG. 8 illustrates an example of a circuit configuration of an SRAM in which six transistors are provided for one memory element. Note that although FIG. 8 illustrates only one memory element, the number of memory elements is not limited to this. A memory element 180 of the SRAM illustrated in FIG. 8 includes an inverter circuit that includes a transistor 186 and a transistor 188, an inverter circuit that includes a transistor 190 and a transistor 192, a transistor 182 and a transistor 184 which are operated as switching transistors.

Writing operation of the SRAM illustrated in FIG. 8 is described. When a specific scan line becomes $V_H$ by a column decoder, the transistor 182 and the transistor 184 are turned on, and data are written to a pair of inverter circuits (the inverter circuit including the transistor 186 and the transistor 188 and the inverter circuit including the transistor 190 and the transistor 192). When writing of data is finished, the transistor 182 and the transistor 184 are turned off, and the data written to the pair of inverter circuits are held.

Next, reading operation of the SRAM illustrated in FIG. 8 is described. First, a first signal line and a second signal line are precharged to a specific potential (a precharge potential) from an external circuit of the memory element array. This precharge potential may be set to a value near the middle of Vdd and Vss. Each of the first and second signal lines having the precharge potential is in a floating state. After that, when the scan line becomes $V_H$, the transistor 182 and the transistor 184 are turned on and the first signal line and the second signal line are driven inversely by the pair of inverter circuits. The potential difference therebetween is detected by a sense amplifier, so that data are read out.

The above-described transistors show almost no temperature dependence of off-state current and can keep an extremely small off-state current value. Therefore, when the above-described transistors are used, refresh interval can be set long as compared with a transistor using silicon, and power consumption in a standby period can be reduced.

In the case of using an SRAM as a memory, the number of transistors formed is not limited to six.

Figure 9:
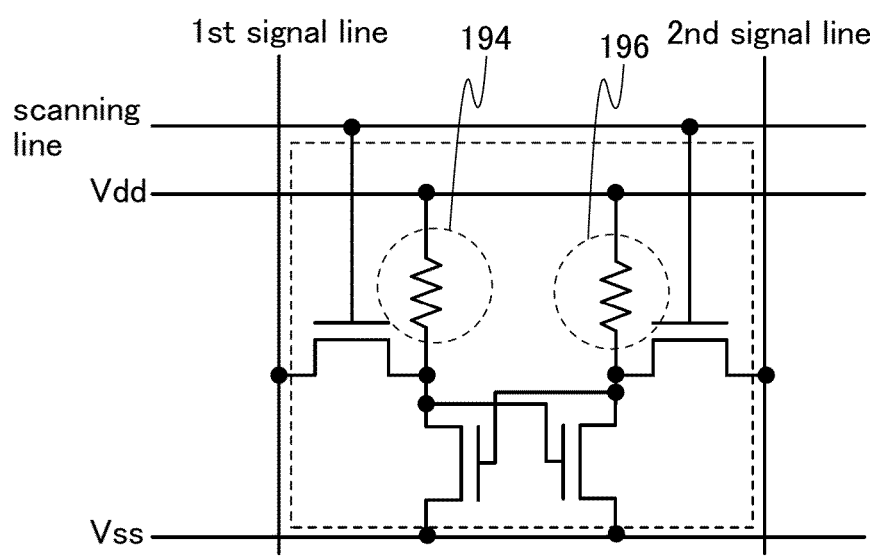
FIG. 9 illustrates a memory circuit (an SRAM) which is one embodiment of the present invention.

FIG. 9 illustrates an example of a circuit configuration of an SRAM in which four transistors are provided for one memory element. In FIG. 9, a resistor 194 and a resistor 196 substitute for the transistor 186 and the transistor 190 of the SRAM illustrated in FIG. 8, respectively.

Even when the SRAM has the circuit configuration illustrated in FIG. 9, refresh interval can be set long as compared with a transistor using silicon, and power consumption in a standby period can be reduced.

As described above, the semiconductor device which is one embodiment of the present invention can be obtained.

Embodiment 2

In this embodiment, a transistor that can be used for the semiconductor device described in Embodiment 1 and is different from the transistor in Embodiment 1 is described.

Figure 10A:
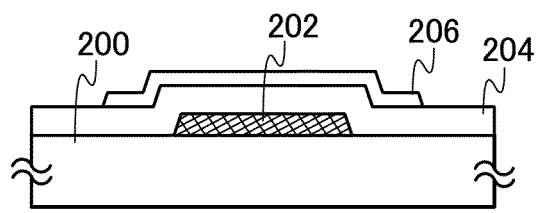
FIGS. 10A to 10D illustrate a transistor which is one embodiment of the present invention and a method for manufacturing the transistor.
Figure 10B:
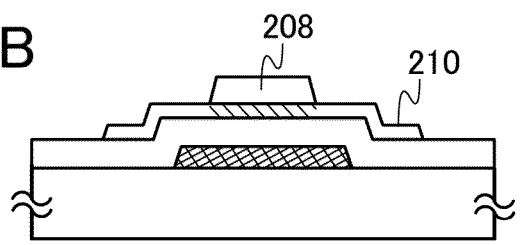
Figure 10C:
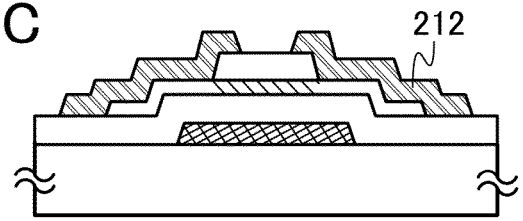
Figure 10D:
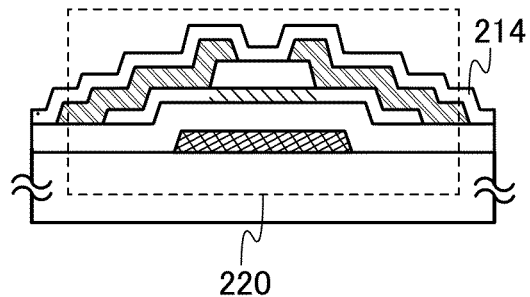

FIGS. 10A to 10D illustrate cross-sectional structures of a transistor of this embodiment. A transistor 220 illustrated in FIG. 10D is one mode of a transistor having a bottom-gate structure called a channel-protective type transistor (or a channel-stop type transistor). A process for manufacturing the transistor 220 over a substrate 200 is described below.

First, a conductive film is formed over the substrate 200 having an insulating surface, and a first photolithography step is performed, so that the conductive film is processed into a gate electrode layer 202.

The gate electrode layer 202 may be formed using a material similar to that for the gate electrode layer 111 and may have a single-layer structure or a stacked-layer structure of a plurality of layers.

Note that a resist mask may be formed by an inkjet method. In the case of forming a resist mask by an inkjet method, the manufacturing cost can be reduced because a photomask is not used.

Next, a gate insulating layer 204 is formed so as to cover the gate electrode layer 202. In this embodiment, a silicon oxynitride layer may be formed by a plasma CVD method as the gate insulating layer 204.

Next, an oxide semiconductor film is formed over the gate insulating layer 204, and then, a second photolithography step is performed, so that the oxide semiconductor film is processed into an island-shaped oxide semiconductor layer. The oxide semiconductor film may be formed to a thickness of more than or equal to 2 nm and less than or equal to 200 nm, for example. In this embodiment, for example, the oxide semiconductor film is formed by a sputtering method with use of an In—Ga—Zn—O-based oxide semiconductor target. At this time, it is preferable to perform sputtering in the state where moisture remaining in a treatment chamber is removed. This is for preventing hydrogen, hydroxy groups, or moisture from being contained in the oxide semiconductor film. Note that, as described in Embodiment 1, an entrapment vacuum pump is preferably used for evacuating the treatment chamber.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the oxide semiconductor film is formed.

Next, as in Embodiment 1, the oxide semiconductor layer is subjected to first heat treatment. Here, the substrate 200 is transferred into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 206 is obtained (FIG. 10A).

Then, plasma treatment using a gas such as $N_2O$, $N_2$, or Ar is preferably performed. Through this plasma treatment, water or the like adsorbed on a surface of the oxide semiconductor layer 206 which is exposed is removed. Alternatively, plasma treatment may be performed using a mixed gas of $O_2$ and Ar.

Next, after an insulating oxide film is formed over the gate insulating layer 204 and the oxide semiconductor layer 206, a third photolithography step is performed, so that an insulating oxide layer 208 is formed, and a resist mask is removed.

In this embodiment, for example, a 200-nm-thick silicon oxide film is formed by a sputtering method as an insulating oxide film to be the insulating oxide layer 208. The substrate temperature in film formation may be more than or equal to room temperature and less than or equal to 300° C., and is 100° C. in this embodiment. The sputtering method may be performed in a rare gas (e.g., argon) atmosphere, an oxygen atmosphere, or an atmosphere of a mixed gas of a rare gas (e.g., argon) and oxygen. Further, a silicon oxide target or a silicon target can be used as a target, for example. For example, with the use of a silicon target, a silicon oxide film can be formed by a sputtering method in a mixed atmosphere of oxygen and nitrogen. As the insulating oxide layer 208 which is formed in contact with the oxide semiconductor layer whose resistance is reduced, an inorganic insulating film which does not contain impurities such as moisture, hydrogen ions, and hydroxy groups and blocks entry of these from the outside is preferably used; for example, a silicon oxide film, a silicon oxynitride film, an aluminum oxide film, an aluminum oxynitride film, or the like is used. At this time, it is preferable to perform sputtering in the state where moisture remaining in a treatment chamber is removed. This is for preventing hydrogen, hydroxy groups, or moisture from being contained in the oxide semiconductor layer 206 and the insulating oxide layer 208. Therefore, in formation of the insulating oxide film, it is preferable to use an entrapment vacuum pump and a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the insulating oxide film is formed.

Here, second heat treatment may be performed.

The temperature of the second heat treatment is preferably more than or equal to 200° C. and less than or equal to 400° C., and more preferably more than or equal to 250° C. and less than or equal to 350° C. Note that the second heat treatment may be performed in an inert gas atmosphere or an oxygen gas atmosphere. In this embodiment, heat treatment may be performed in a nitrogen atmosphere at 250° C. for one hour. In the second heat treatment, heat is applied in the state where part of the oxide semiconductor layer 206 (the channel formation region) is in contact with the insulating oxide layer 208.

Heat treatment after the second heat treatment may further be performed. In this embodiment, heat treatment is performed in a nitrogen gas atmosphere, an inert gas atmosphere, or under a reduced pressure in the state where the insulating oxide layer 208 is formed over the oxide semiconductor layer 206 which is partly exposed. By the heat treatment in a nitrogen gas atmosphere or an inert gas atmosphere or under a reduced pressure, the resistance of the exposed region of the oxide semiconductor layer 206, which is not covered with the insulating oxide layer 208 can be reduced. In this embodiment, for example, heat treatment is performed at 250° C. for 1 hour in a nitrogen atmosphere. By performing the heat treatment in this manner on the oxide semiconductor layer 206 over which the insulating oxide layer 208 is formed, the resistance of the exposed region of the oxide semiconductor layer 206 is reduced and the oxide semiconductor layer 206 becomes an oxide semiconductor layer 210 that includes regions having different resistance. In FIG. 10B, white regions in the oxide semiconductor layer 210 without oblique lines are low-resistance regions.

Through the above process up to and including the second heat treatment, heat treatment for dehydration or dehydrogenation is performed on the deposited oxide semiconductor film to reduce the resistance, and then, part of the oxide semiconductor film is selectively made in an oxygen-excess state. As a result, the channel formation region overlapping with the gate electrode layer 202 becomes an i-type semiconductor having a low conductivity, and a high-resistance source region overlapping with the source electrode layer and a high-resistance drain region overlapping with the drain electrode layer are formed in a self-aligned manner.

Next, after a conductive film is formed over the gate insulating layer 204, the oxide semiconductor layer 210, and the insulating oxide layer 208, a fourth photolithography step is performed, so that source and drain electrode layers 212 are formed, and then a resist mask is removed (FIG. 10C).

The source and drain electrode layers 212 may be formed using a material similar to that for the source electrode layer 115a and the drain electrode layer 115b and may have a single-layer structure or a stacked-layer structure of a plurality of layers.

Here, heat treatment may further be performed at more than or equal to 100° C. and less than or equal to 200° C. for more than or equal to 1 hour and less than or equal to 30 hours in the air. In this embodiment, the heat treatment is performed at 150° C. for 10 hours. This heat treatment may be performed at a fixed heating temperature, or may be performed by repeating increasing a temperature from room temperature to a heat temperature of more than or equal to 100° C. and less than or equal to 200° C. and decreasing the temperature from the heat temperature to room temperature plural times. Further, this heat treatment may be performed before formation of the insulating oxide layer under a reduced pressure. When the heat treatment is performed under a reduced pressure, the heating time can be shortened. With this heat treatment, a normally-off transistor can be obtained.

By the formation of the high-resistance drain region (or the high-resistance source region) in part of the oxide semiconductor layer, which overlaps with the drain electrode layer (and the source electrode layer), the reliability of the transistor can be improved. Specifically, by forming the high-resistant drain region, it is possible to employ a structure in which conductivity can be gradually varied from the drain electrode layer to the high-resistant drain region and the channel formation region. Therefore, in the case where the transistor is operated in the state where the drain electrode layer is connected to a wiring for supplying a high power supply potential Vdd, even when a difference between potentials of the gate electrode layer and the drain electrode layer is large, the high-resistance drain region serves as a buffer, so that the withstand voltage of the transistor can be increased.

Through the above-described process, the transistor 220 is formed.

Next, a protective insulating layer 214 is formed over the insulating oxide layer 208 and the source and drain electrode layers 212. Here, a silicon nitride film may be formed as the protective insulating layer 214 (FIG. 10D).

Note that an insulating oxide layer may further be formed over the insulating oxide layer 208 and the source and drain electrode layers 212, and the protective insulating layer 214 may be formed over the insulating oxide layer.

Although not illustrated, the transistor 220 may be a multigate transistor having a plurality of channel formation regions by forming a plurality of gate electrodes.

This embodiment can be freely combined with any of the other embodiments.

Embodiment 3

In this embodiment, a transistor that can be used for the semiconductor device described in Embodiment 1 and is different from the transistor in Embodiment 1 and Embodiment 2 is described.

Figure 11A:
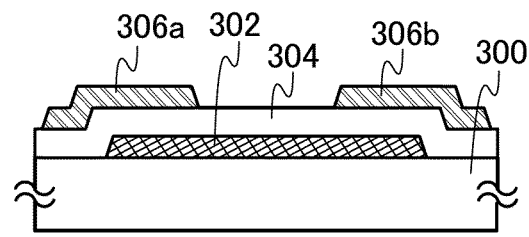
FIGS. 11A to 11D illustrate a transistor which is one embodiment of the present invention and a method for manufacturing the transistor.
Figure 11B:
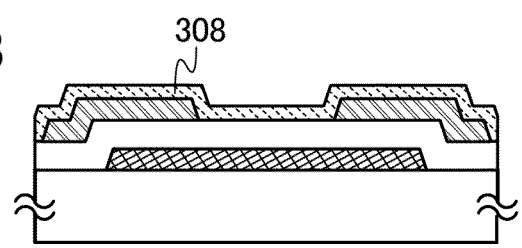
Figure 11C:
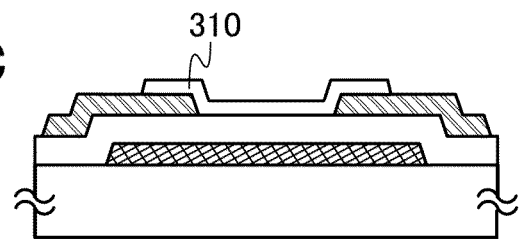
Figure 11D:
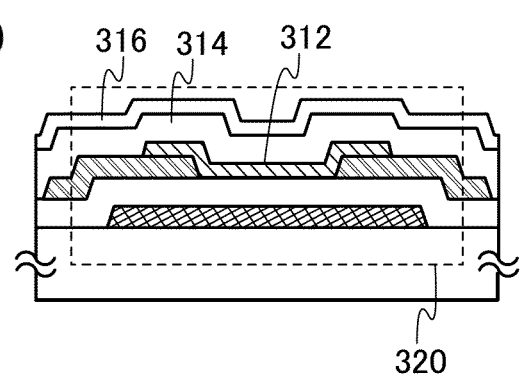

FIGS. 11A to 11D illustrate cross-sectional structures of a transistor of this embodiment. A transistor 320 illustrated in FIG. 11D is one mode of a transistor having a bottom-gate structure. A process for manufacturing the transistor 320 over a substrate 300 is described below.

First, a conductive film is formed over the substrate 300 having an insulating surface, and a first photolithography step is performed, so that the conductive film is processed into a gate electrode layer 302.

The gate electrode layer 302 may be formed using a material similar to that for the gate electrode layer 111 and may have a single-layer structure or a stacked-layer structure of a plurality of layers.

Note that a resist mask may be formed by an inkjet method. In the case of forming a resist mask by an inkjet method, the manufacturing cost can be reduced because a photomask is not used.

Next, a gate insulating layer 304 is formed so as to cover the gate electrode layer 302. In this embodiment, a silicon oxynitride layer may be formed by a plasma CVD method as the gate insulating layer 304.

Next, after a conductive film is formed over the gate insulating layer 304, a second photolithography step is performed, so that source and drain electrode layers 306a and 306b are formed (FIG. 11A).

The source and drain electrode layers 306a and 306b may be formed using a material similar to that for the source electrode layer 115a and the drain electrode layer 115b and may have a single-layer structure or a stacked-layer structure of a plurality of layers.

Next, an oxide semiconductor film 308 is formed over the gate insulating layer 304 and the source and drain electrode layers 306a and 306b (FIG. 11B). Next, the oxide semiconductor film 308 is processed into an island-shaped oxide semiconductor layer in a third photolithography step. At this time, it is preferable to perform sputtering in the state where moisture remaining in a treatment chamber is removed as in Embodiment 1. This is for preventing hydrogen, hydroxy groups, or moisture from being contained in the oxide semiconductor film 308. Note that, as described in Embodiment 1, an entrapment vacuum pump is preferably used for evacuating the treatment chamber.

Next, as in Embodiment 1, the oxide semiconductor layer is subjected to first heat treatment. Here, the substrate 300 is transferred into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 310 is obtained (FIG. 11C).

An insulating oxide layer 314 which serves as a protective insulating film and is in contact with the oxide semiconductor layer 310 is formed. The insulating oxide layer 314 is formed to a thickness of more than or equal to 1 nm preferably by a method with which impurities such as water or hydrogen does not enter the insulating oxide layer 314 in a manner similar to that for forming the above-described oxide semiconductor film. When hydrogen is contained in the insulating oxide layer 314, entry of the hydrogen to the oxide semiconductor layer or extraction of oxygen in the oxide semiconductor layer by the hydrogen is caused, whereby part of the oxide semiconductor layer 310 that is in contact with the insulating oxide layer 314 comes to be n-type (to have a lower resistance) and thus a parasitic channel might be formed. Therefore, it is important that the insulating oxide layer 314 is formed containing as little hydrogen as possible.

The insulating oxide layer 314 can be formed in a manner similar to that of the insulating oxide layer 116.

Next, second heat treatment is performed. The second heat treatment can be performed in a manner similar to that in Embodiment 1. In the second heat treatment, heat is applied in the state where part of the oxide semiconductor layer (the channel formation region) is in contact with the insulating oxide layer 314.

Through the above process, heat treatment for dehydration or dehydrogenation is performed on the deposited oxide semiconductor film to reduce the resistance, and then, the entire surface of the oxide semiconductor film is selectively made to contain excessive oxygen. As a result, an i-type oxide semiconductor layer 312 is formed.

Through the above-described process, the transistor 320 is formed.

Here, heat treatment may further be performed at more than or equal to 100° C. and less than or equal to 200° C. for more than or equal to 1 hour and less than or equal to 30 hours in the air. In this embodiment, the heat treatment is performed at 150° C. for 10 hours. This heat treatment may be performed at a fixed heating temperature, or may be performed by repeating increasing a temperature from room temperature to a heat temperature of more than or equal to 100° C. and less than or equal to 200° C. and decreasing the temperature from the heat temperature to room temperature plural times. Further, this heat treatment may be performed before formation of the insulating oxide layer under a reduced pressure. When the heat treatment is performed under a reduced pressure, the heating time can be shortened. With this heat treatment, a normally-off transistor can be obtained.

A protective insulating layer 316 which is similar to the protective insulating layer 103 may be additionally formed over the insulating oxide layer 314. For example, a silicon nitride film is formed as the protective insulating layer 316 by an RF sputtering method (FIG. 11D).

A planarization insulating layer for planarization may be provided over the protective insulating layer 316.

Although not illustrated, the transistor 320 may be a multi-gate transistor having a plurality of channel formation regions by forming a plurality of gate electrodes.

This embodiment can be freely combined with any of the other embodiments.

Embodiment 4

In this embodiment, a transistor that can be used for the semiconductor device described in Embodiment 1 and is different from the transistor in any of Embodiments 1 to 3 is described.

Figure 12A:
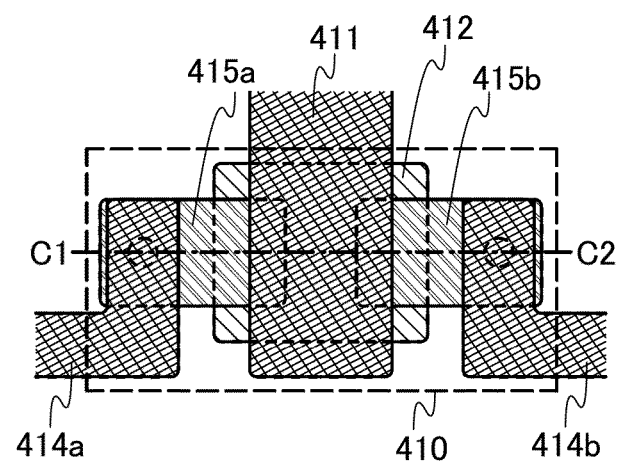
FIGS. 12A and 12B illustrate a transistor which is one embodiment of the present invention.
Figure 12B:
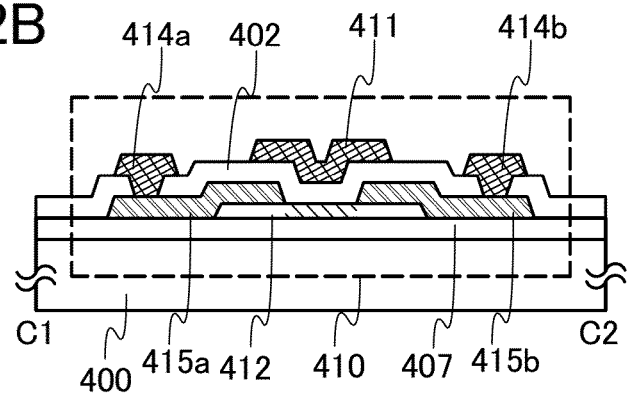

FIG. 12A illustrates an example of a plan view of a transistor, and FIG. 12B illustrates a cross-sectional view thereof taken along C1-C2 in FIG. 12A. A transistor 410 illustrated in FIGS. 12A and 12B is one of top-gate transistors.

The transistor 410 includes, over a substrate 400 having an insulating surface, an insulating layer 407, an oxide semiconductor layer 412, source and drain electrode layers 415a and 415b, a gate insulating layer 402, and a gate electrode layer 411. A wiring layer 414a and a wiring layer 414b are provided so as to be in contact with and electrically connected to the source and drain electrode layers 415a and 415b, respectively.

A process for manufacturing the transistor 410 over a substrate 400 is described below.

First, the insulating layer 407 which serves as a base film is formed over the substrate 400 having an insulating surface. As the insulating layer 407, an insulating oxide layer such as a silicon oxide layer, a silicon oxynitride layer, an aluminum oxide layer, or an aluminum oxynitride layer is preferably used. Although a plasma CVD method, a sputtering method, or the like can be employed as a method for forming the insulating layer 407, the insulating layer 407 is preferably formed with a sputtering method so that impurities such as hydrogen is contained in the insulating layer 407 as little as possible.

In this embodiment, a silicon oxide layer is formed as the insulating layer 407 with a sputtering method. The substrate 400 is transferred into a treatment chamber and a sputtering gas from which hydrogen and moisture are removed and which contains high-purity oxygen is introduced, whereby a silicon oxide layer is formed with the use of a silicon target or a quartz target. The substrate 400 may be at room temperature or may be heated.

At this time, it is preferable to perform sputtering in the state where moisture remaining in a treatment chamber is removed. This is for preventing hydrogen, hydroxy groups, or moisture from being contained in the insulating layer 407. Note that, as described in Embodiment 1, an entrapment vacuum pump is preferably used for evacuating the treatment chamber.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the insulating layer 407 is formed.

Further, the insulating layer 407 may have a stacked-layer structure in which for example, an insulating nitride layer such as a silicon nitride layer, a silicon nitride oxide layer, an aluminum nitride layer, or an aluminum nitride oxide layer and an insulating oxide layer are stacked in this order over the substrate 400.

For example, a sputtering gas from which hydrogen and moisture are removed and which contains high-purity nitrogen is introduced into the treatment chamber and a silicon target is used, whereby a silicon nitride layer is formed over a substrate, and a silicon oxide layer is formed thereover. In this case, the silicon nitride layer is preferably formed in the state where moisture remaining in a treatment chamber is removed in a manner similar to that for the silicon oxide layer.

In the case where the stack of the silicon nitride layer and the silicon oxide layer is provided as the insulating layer 407, the silicon nitride layer and the silicon oxide layer can be formed with the use of a common silicon target in the same treatment chamber. After a sputtering gas containing nitrogen is introduced into the treatment chamber first, a silicon nitride layer is formed using a silicon target in the treatment chamber, and then, the sputtering gas is switched to a sputtering gas containing oxygen and the same silicon target is used to form a silicon oxide layer. Since the silicon nitride layer and the silicon oxide layer can be formed successively without being exposed to the air in such sputtering, impurities such as hydrogen and moisture can be prevented from adsorbing onto a surface of the silicon nitride layer.

Next, an oxide semiconductor film is formed over the insulating layer 407. The oxide semiconductor film is preferably formed to a thickness of more than or equal to 2 nm and less than or equal to 200 nm by a sputtering method.

The substrate 400 over which the insulating layer 407 is formed is preferably preheated in a preheat chamber of a sputtering apparatus as pretreatment, and impurities such as hydrogen or moisture adsorbed on the substrate 400 are preferably eliminated and evacuated, in order that the oxide semiconductor film contain as little hydrogen, hydroxy groups, and moisture as possible. The preheat chamber is preferably provided with a cryopump and evacuated with the cryopump. Note that this pretreatment of preheating may be performed on the substrate 400 before forming the gate insulating layer 402 or the substrate 400 over which the layers up to and including the source and drain electrode layers 415a and 415b are formed, in a similar manner.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the oxide semiconductor film is formed.

A sputtering gas from which hydrogen and moisture are removed is introduced into the treatment chamber in the state where moisture remaining in the treatment chamber is removed, and the oxide semiconductor film is formed with the use of a metal oxide as a target. Note that an entrapment vacuum pump is preferably used for evacuating the treatment chamber.

Next, a first photolithography step is performed, so that the oxide semiconductor film is processed into an island-shaped oxide semiconductor layer. A resist mask for forming the island-shaped oxide semiconductor layer may be formed by an inkjet method. In the case of forming a resist mask by an inkjet method, the manufacturing cost can be reduced because a photomask is not used.

Note that the etching of the oxide semiconductor film here may be performed by dry etching, wet etching, or both wet etching and dry etching in combination.

As the dry etching method, a parallel plate RIE (reactive ion etching) method or an ICP (inductively coupled plasma) etching method can be used.

As an etchant used for wet etching, a solution obtained by mixing phosphoric acid, acetic acid, and nitric acid, an ammonia hydrogen peroxide mixture (hydrogen peroxide solution at 31 wt %:ammonia water at 28 wt %:water=5:2:2), or the like can be used. Specifically, ITO07N (produced by Kanto Chemical Co., Inc.), which is commercially available as an etchant for a transparent conductive film from Kanto Chemical Co., Inc., may also be used.

The etchant after the wet etching is removed together with the etched-off materials by cleaning. The waste liquid including the etchant and the material etched off may be purified and the material may be reused. Materials such as indium contained in the oxide semiconductor layer are collected from the waste liquid after the etching and recycled, so that resources can be effectively used and cost can be reduced.

In this embodiment, the oxide semiconductor film is processed into the island-shaped oxide semiconductor layer with a wet etching method with a mixed solution of phosphoric acid, acetic acid, and nitric acid as an etchant.

Figure 13A:
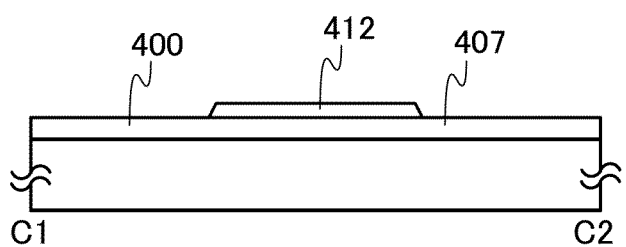
FIGS. 13A to 13E illustrate a transistor which is one embodiment of the present invention and a method for manufacturing the transistor.

Next, as in Embodiment 1, the oxide semiconductor layer is subjected to first heat treatment. Here, the substrate 400 is transferred into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 412 is obtained (FIG. 13A).

The first heat treatment of the oxide semiconductor layer can be performed on the oxide semiconductor film before being processed into the island-shaped oxide semiconductor layer. In that case, after the first heat treatment, the substrate is taken out of the heat treatment apparatus, and then a photolithography step is performed.

The heat treatment having effects of dehydration or dehydrogenation of the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive film is formed over the insulating layer 407 and the oxide semiconductor layer 412. The conductive film may be formed in a manner similar to that for the conductive film for the source electrode layer 115a and drain electrode layer 115b.

Figure 13B:
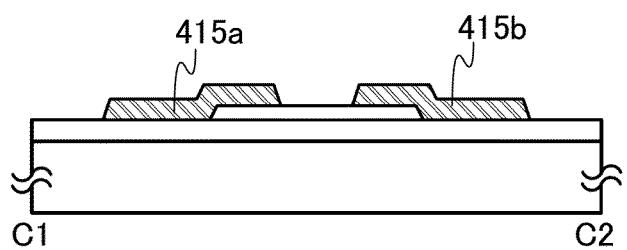

Next, a second photolithography process is performed. A resist mask is formed over the conductive film and the conductive film is processed, so that the source and drain electrode layers 415a and 415b are formed, and then, the resist mask is removed (FIG. 13B). Note that the source electrode layer and the drain electrode layer preferably have tapered shapes because coverage with the gate insulating layer stacked thereover can be improved.

In this embodiment, a Ti film is used as the conductive film, and an In—Ga—Zn—O-based oxide semiconductor is used for the oxide semiconductor layer 412. As an etchant, an ammonia hydrogen peroxide mixture (a mixed solution of ammonia, water, and a hydrogen peroxide solution) is used.

In the second photolithography step, only part of the oxide semiconductor layer 412 is etched off, and an oxide semiconductor layer having a groove (a depressed portion) is formed in some cases. A resist mask for forming the source electrode layer 415a and the drain electrode layer 415b may be formed by an inkjet method. In the case of forming a resist mask by an inkjet method, the manufacturing cost can be reduced because a photomask is not used.

Ultraviolet light, KrF laser light, or ArF laser light is preferably used for light exposure for forming the resist mask in the second photolithography step. Note that in the case where light exposure is performed so that the channel length L becomes less than 25 nm, light exposure is preferably performed using extreme ultraviolet with an extremely short wavelength of several nanometers to several tens of nanometers.

Figure 13C:
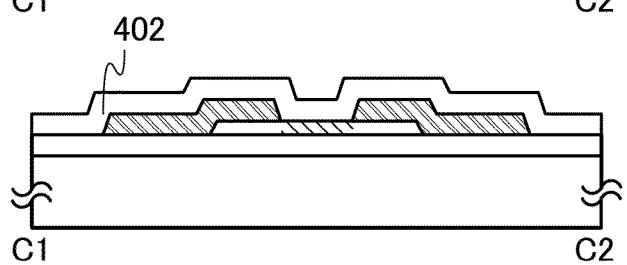

Next, a gate insulating layer 402 is formed over the insulating layer 407, the oxide semiconductor layer 412, the source electrode layer 415a, and the drain electrode layer 415b (FIG. 13C).

The gate insulating layer 402 can be formed in a manner similar to that for the gate insulating layer 102.

Figure 13D:
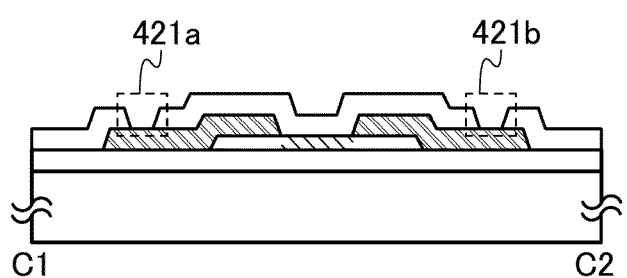

Next, a third photolithography step is performed to form a resist mask, and etching is selectively performed to remove part of the gate insulating layer 402, so that openings 421a and 421b reaching the source electrode layer 415a and the drain electrode layer 415b are formed (FIG. 13D).

Then, after a conductive film is formed over the gate insulating layer 402 and in the openings 421a and 421b, the gate electrode layer 411 and the wiring layers 414a and 414b are formed in a fourth photolithography process. Note that a resist mask may be formed by an inkjet method. In the case of forming a resist mask by an inkjet method, the manufacturing cost can be reduced because a photomask is not used.

The gate electrode layer 411, the wiring layer 414a and 414b can be formed in a manner similar to that of the gate electrode layer 111.

Note that the gate electrode layer 411 can also be formed using a light-transmitting conductive film. As an example of a material of the light-transmitting conductive film, a light-transmitting conductive oxide or the like can be given.

Next, second heat treatment may be performed.

The temperature of the second heat treatment is preferably more than or equal to 200° C. and less than or equal to 400° C., and more preferably more than or equal to 250° C. and less than or equal to 350° C. Note that the second heat treatment may be performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the transistor 410.

Here, heat treatment may further be performed at more than or equal to 100° C. and less than or equal to 200° C. for more than or equal to 1 hour and less than or equal to 30 hours in the air. In this embodiment, the heat treatment is performed at 150° C. for 10 hours. This heat treatment may be performed at a fixed heating temperature, or may be performed by repeating increasing a temperature from room temperature to a heat temperature of more than or equal to 100° C. and less than or equal to 200° C. and decreasing the temperature from the heat temperature to room temperature plural times. Further, this heat treatment may be performed before formation of the insulating oxide layer under a reduced pressure. When the heat treatment is performed under a reduced pressure, the heating time can be shortened. With this heat treatment, a normally-off transistor can be obtained.

Figure 13E:
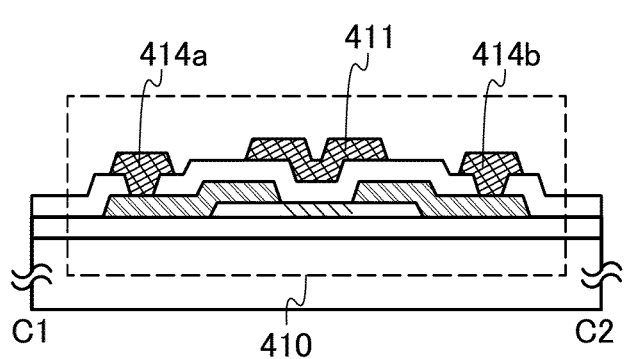

Through the above-described process, the transistor 410 can be formed (FIG. 13E).

A protective insulating layer or a planarization insulating layer for planarization may be provided over the transistor 410. For example, the protective insulating layer may be formed to have a single-layer structure or a stacked-layer structure using one or more of a silicon oxide layer, a silicon nitride layer, a silicon oxynitride layer, a silicon nitride oxide layer, and an aluminum oxide layer.

By removing moisture included in a treatment chamber when the oxide semiconductor film is formed in the above manner, the concentration of hydrogen and that of hydrides contained in the oxide semiconductor film can be reduced.

Although not illustrated, the transistor 410 may be a multi-gate transistor having a plurality of channel formation regions by forming a plurality of gate electrodes.

This embodiment can be freely combined with any of the other embodiments.

Embodiment 5

In this embodiment, a transistor that can be used for the semiconductor device described in Embodiment 1 and is different from the transistor in any of Embodiments 1 to 4 is described.

Figure 14A:
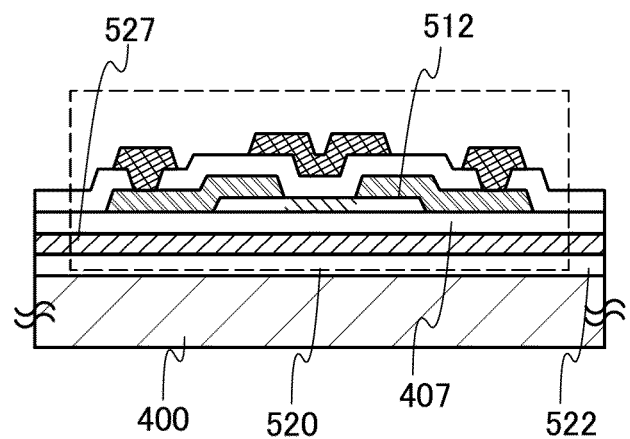
FIGS. 14A and 14B each illustrate a transistor which is one embodiment of the present invention.

FIG. 14A illustrates a cross-sectional structure of a transistor of this embodiment. A transistor 520 illustrated in FIG. 14A includes an insulating layer 522 and a conductive layer 527 interposed between the substrate 400 and the insulating layer 407 of the transistor 410 illustrated in FIG. 13E. The conductive layer 527 overlaps with the entire oxide semiconductor layer 512. A transistor 521 illustrated in FIG. 14B includes the insulating layer 522 and a conductive layer 524 interposed between the substrate 400 and the insulating layer 407 of the transistor 410 illustrated in FIG. 13E. The conductive layer 524 overlaps with part of the oxide semiconductor layer 512 (specifically, a channel formation region).

The conductive layer 524 and the conductive layer 527 may be formed using the same material and method as the gate electrode layers of the transistor 520 and the transistor 521, or may be formed using different materials and methods. The conductive layer 524 and the conductive layer 527 can function as a second gate electrode layer. Potentials of the conductive layer 524 and the conductive layer 527 may each be a fixed potential of GND or 0 V.

It is possible to control electric characteristics of the transistor 520 and the transistor 521 (e.g., threshold voltages) by the conductive layer 524 and the conductive layer 527.

This embodiment can be freely combined with any of the other embodiments.

Embodiment 6

In this embodiment, a transistor that can be used for the semiconductor device described in Embodiment 1 and is different from the transistor in any of Embodiments 1 to 5 is described.

Figure 15A:
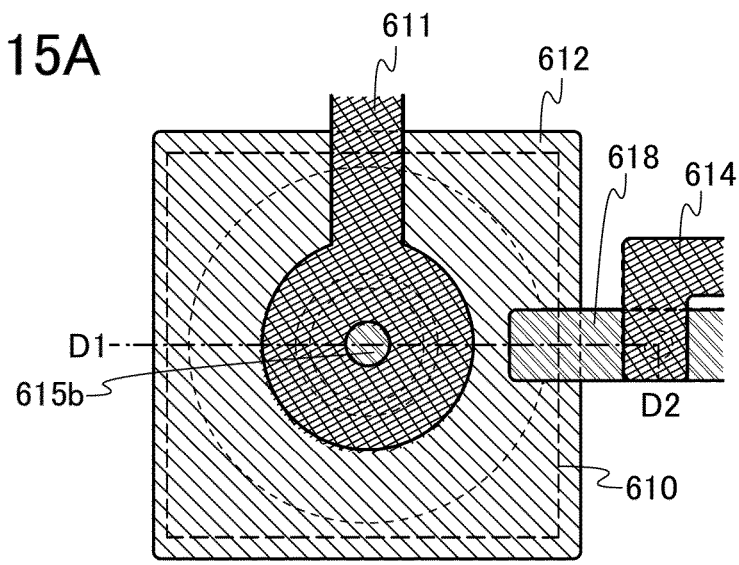
FIGS. 15A and 15B illustrate a transistor which is one embodiment of the present invention.
Figure 15B:
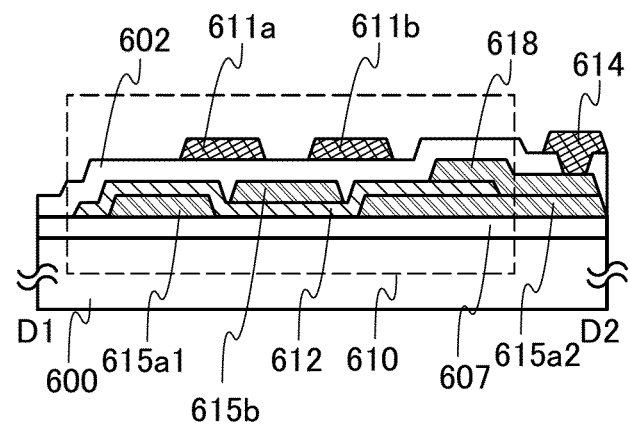

FIG. 15A illustrates a plan view of a transistor 610 having a top-gate structure of this embodiment, and FIG. 15B illustrates a cross-sectional view thereof taken along D1-D2 in FIG. 15A.

The transistor 610 includes, over a substrate 600 having an insulating surface, an insulating layer 607, source and drain electrode layer 615a (615a1 and 615a2), an oxide semiconductor layer 612, source and drain electrode layer 615b, a wiring layer 618, a gate insulating layer 602, and a gate electrode layer 611 (611a and 611b). The source and drain electrode layer 615a (615a1 and 615a2) are electrically connected to the wiring layer 614 through the wiring layer 618. Although not illustrated, the source and drain electrode layer 615b is electrically connected to the wiring layer 614 in an opening formed in the gate insulating layer 602.

A process for manufacturing the transistor 610 over a substrate 600 is described below with reference to FIGS. 16A to 16E.

First, the insulating layer 607 which serves as a base film is formed over the substrate 600 having an insulating surface.

In this embodiment, a silicon oxide layer is formed as the insulating layer 607 with a sputtering method. The substrate 600 is transferred into a treatment chamber and a sputtering gas from which hydrogen and moisture are removed and which contains high-purity oxygen is introduced, whereby a silicon oxide layer is formed with the use of a silicon target or a quartz target as the insulating layer 607 over the substrate 600. Note that oxygen or a mixed gas of oxygen and argon is used as a sputtering gas.

At this time, it is preferable to perform sputtering in the state where moisture remaining in a treatment chamber is removed. This is for preventing hydrogen, hydroxy groups, or moisture from being contained in the insulating layer 607. Note that, as described in Embodiment 1, an entrapment vacuum pump is preferably used for evacuating the treatment chamber.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the insulating layer 607 is formed.

Further, the insulating layer 607 may have a stacked-layer structure in which for example, an insulating nitride layer such as a silicon nitride layer, a silicon nitride oxide layer, an aluminum nitride layer, or an aluminum nitride oxide layer and an oxide insulating layer are stacked in this order over the substrate 600.

For example, a sputtering gas from which hydrogen and moisture are removed and which contains high-purity nitrogen is introduced into the treatment chamber and a silicon target is used, whereby a silicon nitride layer is formed over a substrate, and a silicon oxide layer is formed thereover. In this case, the silicon nitride layer is preferably formed in the state where moisture remaining in a treatment chamber is removed in a manner similar to that for the silicon oxide layer.

Figure 16A:
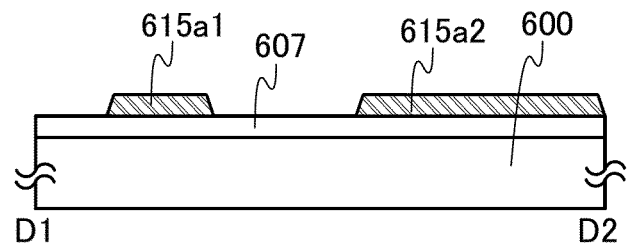
FIGS. 16A to 16E illustrate a transistor which is one embodiment of the present invention and a method for manufacturing the transistor.

Next, a conductive film is formed over the insulating layer 607 and a first photolithography process is performed. A resist mask is formed over the conductive film and the conductive film is processed, so that the source and drain electrode layers 615a1 and 615a2 are formed, and then, the resist mask is removed (FIG. 16A). In the cross-sectional view, the source and drain electrode layers 615a1 and 615a2 seem to be separated from each other; however, they are not actually separated. Note that the source and drain electrode layers 615a1 and 615a2 preferably have tapered shapes because coverage with the oxide semiconductor layer 612 stacked thereover can be improved.

As a material of the source and drain electrode layers 615a1 and 615a2, an element selected from Al, Cr, Cu, Ta, Ti, Mo, and W; an alloy containing any of these elements as a component; an alloy film containing any of these elements in combination; and the like can be given. In addition, one or more of Mn, Mg, Zr, Be, and Th may also be used. The conductive film may have a single-layer structure or a stacked-layer structure of a plurality of layers. For example, a single-layer structure of an Al film containing Si, a two-layer structure in which a Ti film is stacked over an Al film, a three-layer structure in which an Al film is interposed between two Ti films, or the like can be given. When the conductive film includes an Al film, it may contain Nd or Sc. Note that these films may be nitride films.

In this embodiment, a 150-nm-thick titanium film is formed as the source and drain electrode layers 615a1 and 615a2 by a sputtering method.

Next, an oxide semiconductor film with a thickness more than or equal to 2 nm and less than or equal to 200 nm is formed over the insulating layer 607 and the source and drain electrode layers 615a1 and 615a2.

Note that the oxide semiconductor film is preferably formed in the state where moisture remaining in the treatment chamber is removed. This is for preventing hydrogen, hydroxy groups, or moisture from being contained in the oxide semiconductor film. An entrapment vacuum pump is preferably used for evacuating the treatment chamber.

It is preferable to use a high-purity gas from which impurities such as hydrogen, water, hydroxy groups, or hydrides are removed to a concentration of less than or equal to 1 ppm (preferably, a concentration of less than or equal to 10 ppb) as a sputtering gas used when the oxide semiconductor film is formed.

Figure 16B:
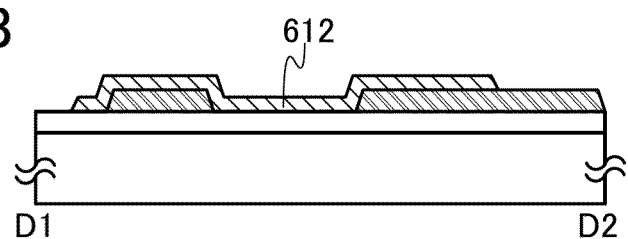

Next, a second photolithography step is performed, so that the oxide semiconductor film is processed into an island-shaped oxide semiconductor layer (FIG. 16B). In this embodiment, the oxide semiconductor film is formed by a sputtering method with use of an In—Ga—Zn—O-based oxide semiconductor target.

Next, first heat treatment is performed on the island-shaped oxide semiconductor layer, so that dehydration or dehydrogenation of the oxide semiconductor layer is conducted. The temperature of the first heat treatment is more than or equal to 400° C. and less than or equal to 750° C., preferably more than or equal to 400° C. and less than the strain point of the substrate. Here, the substrate 600 is transferred into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 612 is obtained (FIG. 16B).

The heat treatment apparatus is not limited to the above-described electric furnace but may be a heat treatment apparatus provided with a unit that heats an object to be processed by thermal conduction or thermal radiation from a heater such as a resistance heater or the like. For example, an RTA (rapid thermal anneal) apparatus such as a GRTA (gas rapid thermal anneal) apparatus or an LRTA (lamp rapid thermal anneal) apparatus can be used. Note that the GRTA apparatus is a heat treatment apparatus using a high-temperature gas. As the high-temperature gas, an inert gas which is unlikely to react with an object to be processed by heat treatment, such as nitrogen gas or a rare gas like argon, is used. GRTA enables a high-temperature heat treatment for a short time.

Note that it is preferable that in the first heat treatment, nitrogen or a rare gas such as helium, neon, or argon, which is a gas introduced into the treatment chamber does not contain water, hydrogen, and the like. Alternatively, the purity of a nitrogen gas or a rare gas such as helium, neon, or argon which is introduced into the heat treatment apparatus is preferably 6N (99.9999%) or higher, more preferably 7N (99.99999%) or higher (that is, the impurity concentration is less than or equal to 1 ppm, preferably less than or equal to 0.1 ppm).

The first heat treatment of the oxide semiconductor layer can be performed on the oxide semiconductor film before being processed into the island-shaped oxide semiconductor layer. In that case, after the first heat treatment, the substrate is taken out of the heat treatment apparatus, and then a photolithography step is performed.

The heat treatment having effects of dehydration or dehydrogenation of the oxide semiconductor layer may be performed at any of the following timings: after the oxide semiconductor layer is formed; after a source electrode and a drain electrode are further formed over the oxide semiconductor layer; and after a gate insulating layer is formed over the source electrode and the drain electrode.

Figure 16C:
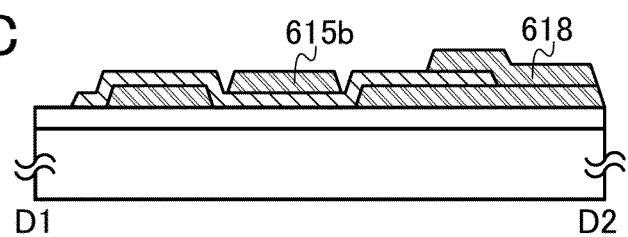

Next, a conductive film is formed over the insulating layer 607 and the oxide semiconductor layer 612, and a third photolithography step is performed. A resist mask is formed over the conductive film and the conductive film is processed, so that the source and drain electrode layers 615b and the wiring layer 618 are formed. After that, the resist mask is removed (FIG. 16C). The source and drain electrode layer 615b and the wiring layer 618 may be formed using a material and steps similar to those of the source and drain electrode layers 615a1 and 615a2.

In this embodiment, a 150-nm-thick titanium film is formed as the source and drain electrode layer 615b and the wiring layer 618 by a sputtering method. In this embodiment, since the same titanium films are used for the source and drain electrode layers 615a1 and 615a2 and the source and drain electrode layer 615b, etching selectivity of the source and drain electrode layers 615a1 and 615a2 with respect to the source and drain electrode layer 615b is not obtained. Thus, the wiring layer 618 is provided over part of the source and drain electrode layer 615a2 which is not covered with the oxide semiconductor layer 612 so that the source and drain electrode layers 615a1 and 615a2 are not etched at the time of etching of the source and drain electrode layer 615b. In the case where high etching selectivity ratio of the source and drain electrode layers 615a1 and 615a2 to the source and drain electrode layer 615b can be obtained, the wiring layer 618 is not necessarily provided.

Note that each material and etching conditions are adjusted as appropriate so that the oxide semiconductor layer 612 is not removed in etching of the conductive film.

In this embodiment, a Ti film is used as the conductive film, and an In—Ga—Zn—O-based oxide semiconductor is used for the oxide semiconductor layer 612. As an etchant, an ammonia hydrogen peroxide mixture (a mixed solution of ammonia, water, and a hydrogen peroxide solution) is used.

In the third photolithography step, only part of the oxide semiconductor layer 612 is etched off, and an oxide semiconductor layer having a groove (a depressed portion) is formed in some cases. A resist mask for forming the source and drain electrode layer 615b and the wiring layer 618 may be formed by an inkjet method. In the case of forming a resist mask by an inkjet method, the manufacturing cost can be reduced because a photomask is not used.

Next, a gate insulating layer 602 is formed over the insulating layer 607, the oxide semiconductor layer 612, the source and drain electrode layers 615a1 and 615a2, and the source and drain electrode layer 615b.

The gate insulating layer 602 can be formed to have a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. Note that the insulating layer 602 is preferably formed with a sputtering method so that a large amount of hydrogen is not contained in the gate insulating layer 602. In the case where a silicon oxide film is formed by a sputtering method, a silicon target or a quartz target is used as a target, and oxygen or a mixed gas of oxygen and argon is used as a sputtering gas.

The gate insulating layer 602 may have a structure where a silicon oxide layer and a silicon nitride layer are stacked over the source and drain electrode layers 615a1 and 615a2 and the source and drain electrode layer 615b. In this embodiment, a silicon oxide layer is formed to a thickness of 100 nm with a sputtering method in a mixed gas atmosphere of oxygen and argon.

Figure 16D:
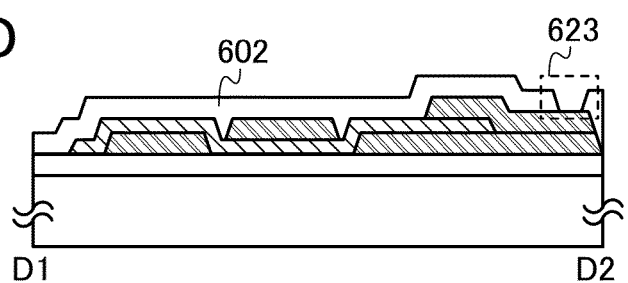

Next, a fourth photolithography process is performed. A resist mask is formed and selective etching is performed to remove part of the gate insulating layer 602, so that an opening 623 reaching the wiring layer 618 is formed (FIG. 16D). Although not illustrated, in forming the opening 623, an opening reaching the source and drain electrode layer 615b may be formed.

Then, after a conductive film is formed over the gate insulating layer 602 and in the opening 623, the gate electrode layer 611 (the gate electrode layer 611a and the gate electrode layer 611b) and the wiring layer 614 are formed in a fifth photolithography process. Note that a resist mask may be formed by an inkjet method. In the case of forming a resist mask by an inkjet method, the manufacturing cost can be reduced because a photomask is not used.

The gate electrode layer 611 (the gate electrode layer 611a and the gate electrode layer 611b) and the wiring layer 614 can be formed to have a single-layer structure or a stacked-layer structure using one or more of metal materials such as Mo, Ti, Cr, Ta, W, Al, Cu, Nd and Sc, and alloy materials containing the above metal material as its main component.

In this embodiment, a 150-nm-thick titanium film is formed as the gate electrode layer 611 (the gate electrode layer 611a and the gate electrode layer 611b) and the wiring layer 614 by a sputtering method.

Next, second heat treatment is performed. The temperature of the second heat treatment is preferably more than or equal to 200° C. and less than or equal to 400° C., and more preferably more than or equal to 250° C. and less than or equal to 350° C. Note that the second heat treatment may be performed in an inert gas atmosphere or an oxygen gas atmosphere. In this embodiment, the second heat treatment is performed in a nitrogen atmosphere at 250° C. for one hour. The second heat treatment is performed in the state where part of the oxide semiconductor layer (a channel formation region) is in contact with the gate insulating layer 602. Note that the second heat treatment may be performed after a protective insulating layer or a planarization insulating layer is formed over the transistor 610.

Here, heat treatment may further be performed at more than or equal to 100° C. and less than or equal to 200° C. for more than or equal to 1 hour and less than or equal to 30 hours in the air. This heat treatment may be performed at a fixed heating temperature, or may be performed by repeating increasing a temperature from room temperature to a heat temperature of more than or equal to 100° C. and less than or equal to 200° C. and decreasing the temperature from the heat temperature to room temperature plural times. Further, this heat treatment may be performed before formation of the insulating oxide layer under a reduced pressure.

Figure 16E:
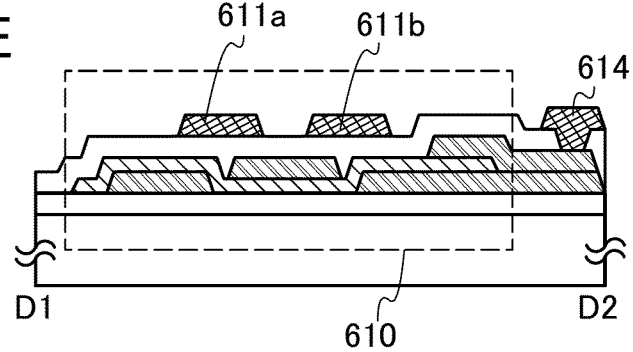

Through the above process, the transistor 610 including the oxide semiconductor layer 612 in which the concentration of hydrogen, moisture, hydrides, and hydroxides is reduced can be formed (FIG. 16E).

A protective insulating layer or a planarization insulating layer for planarization may be provided over the transistor 610. Although not illustrated, an opening reaching the source and drain electrode layer 615b is formed in the gate insulating layer 602, the protective insulating layer, and the planarization insulating layer. A wiring layer is formed in the opening to be electrically connected to the source and drain electrode layer 615b.

This embodiment can be freely combined with any of the other embodiments.

Embodiment 7

Figure 14B:
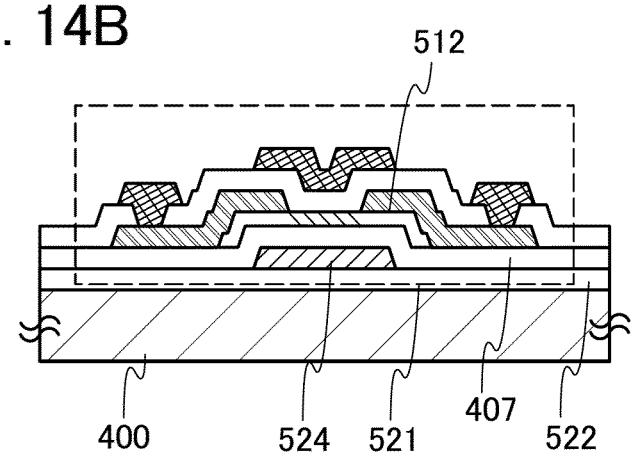

In this embodiment, a transistor which is one embodiment of the present invention whose structure is similar to that of the transistor illustrated in FIG. 14B is described with reference to energy band diagrams.

Figure 17:
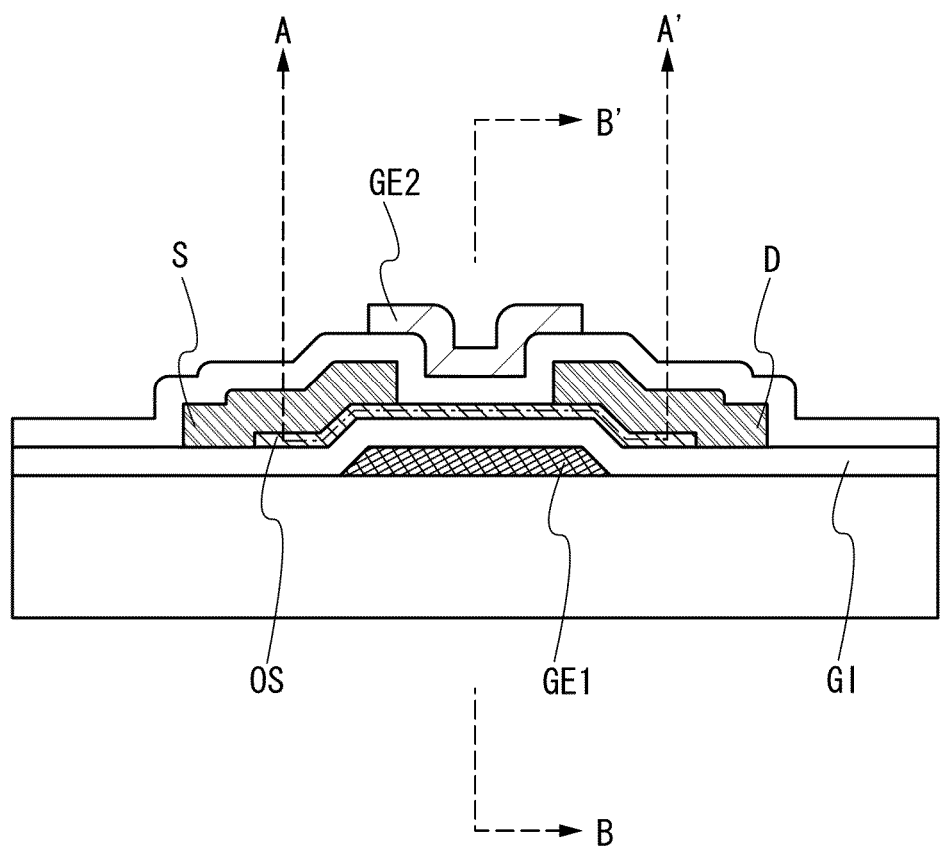
FIG. 17 illustrates a transistor which is one embodiment of the present invention.

FIG. 17 is a longitudinal sectional view of an inverted staggered thin film transistor of this embodiment in which an oxide semiconductor is used. An oxide semiconductor film (OS) is provided over a gate electrode (GE1) with a gate insulating film (GI) therebetween, and a source electrode (S) and a drain electrode (D) are provided over the oxide semiconductor film.

Figure 18A:
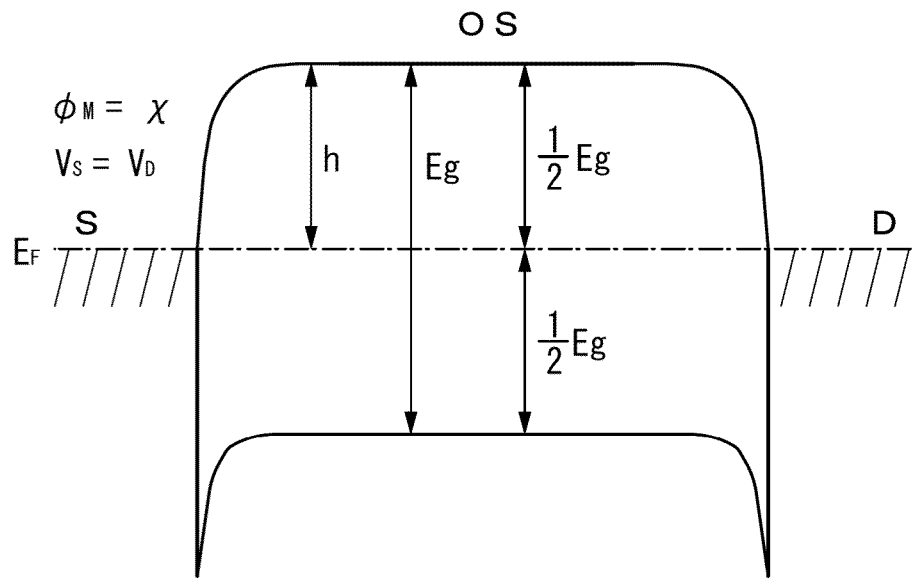
FIGS. 18A and 18B are energy band diagrams on A-A' in FIG. 17.
Figure 18B:
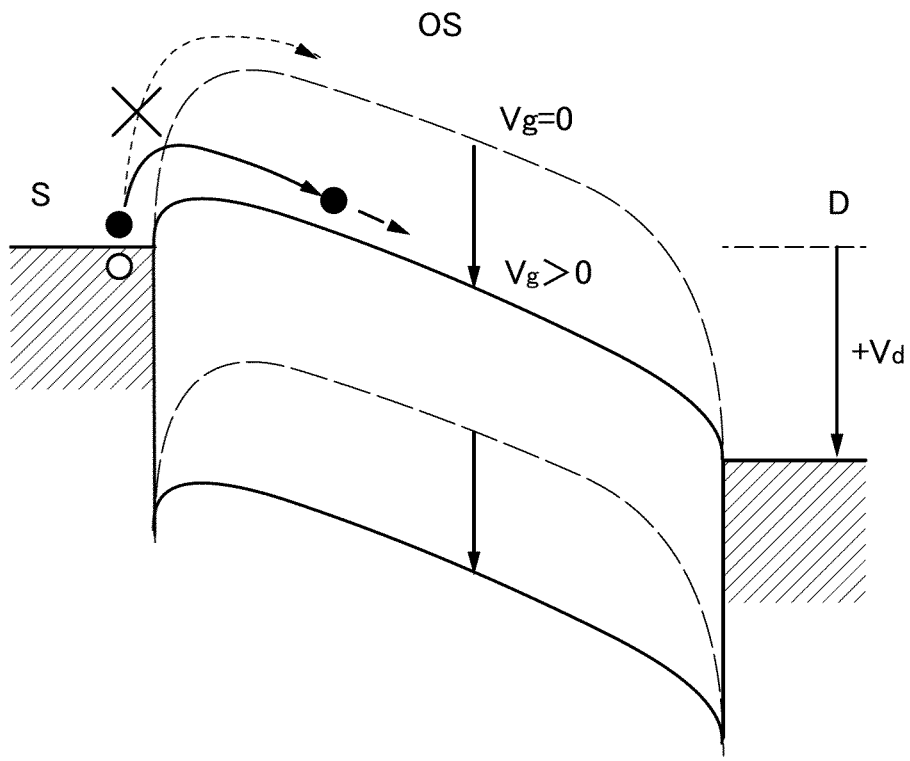

FIGS. 18A and 18B are energy band diagrams (schematic diagrams) on A-A' in FIG. 17. FIG. 18A shows a case where the source and the drain have voltage of the same potential ($V_d=0$ V). FIG. 18B shows a case where positive potential is applied to the drain ($V_d>0$ V) whereas positive potential is not applied to the source.

Figure 19A:
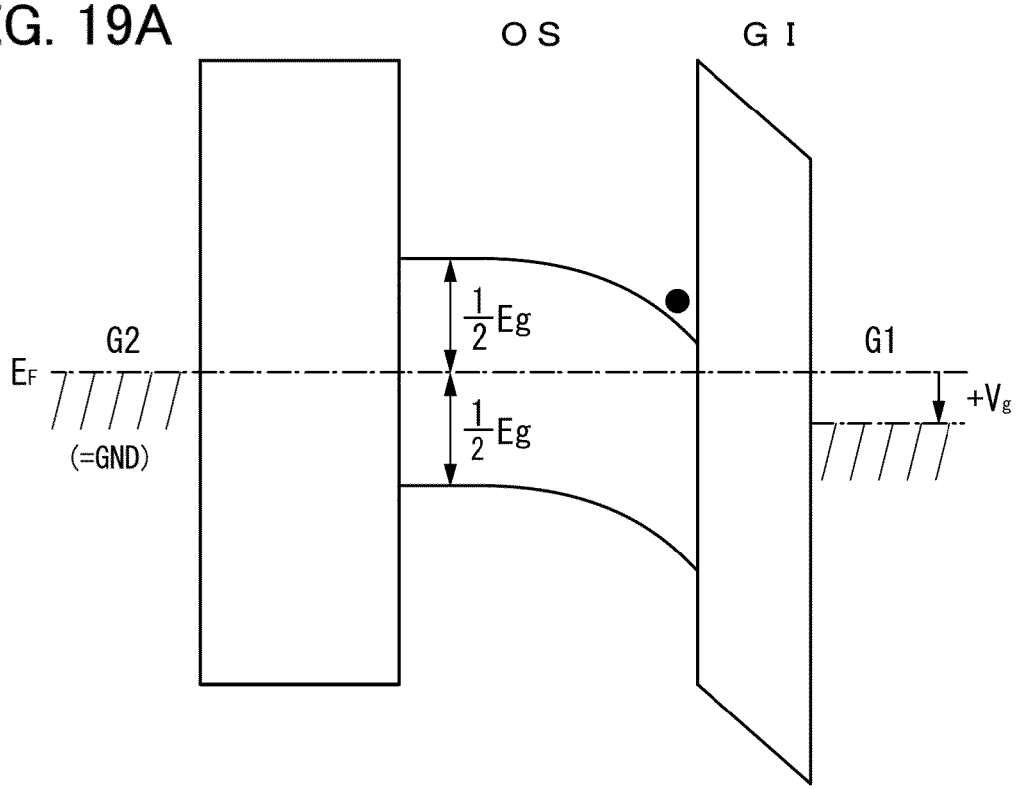
FIGS. 19A and 19B are energy band diagrams on B-B' in FIG. 17.
Figure 19B:
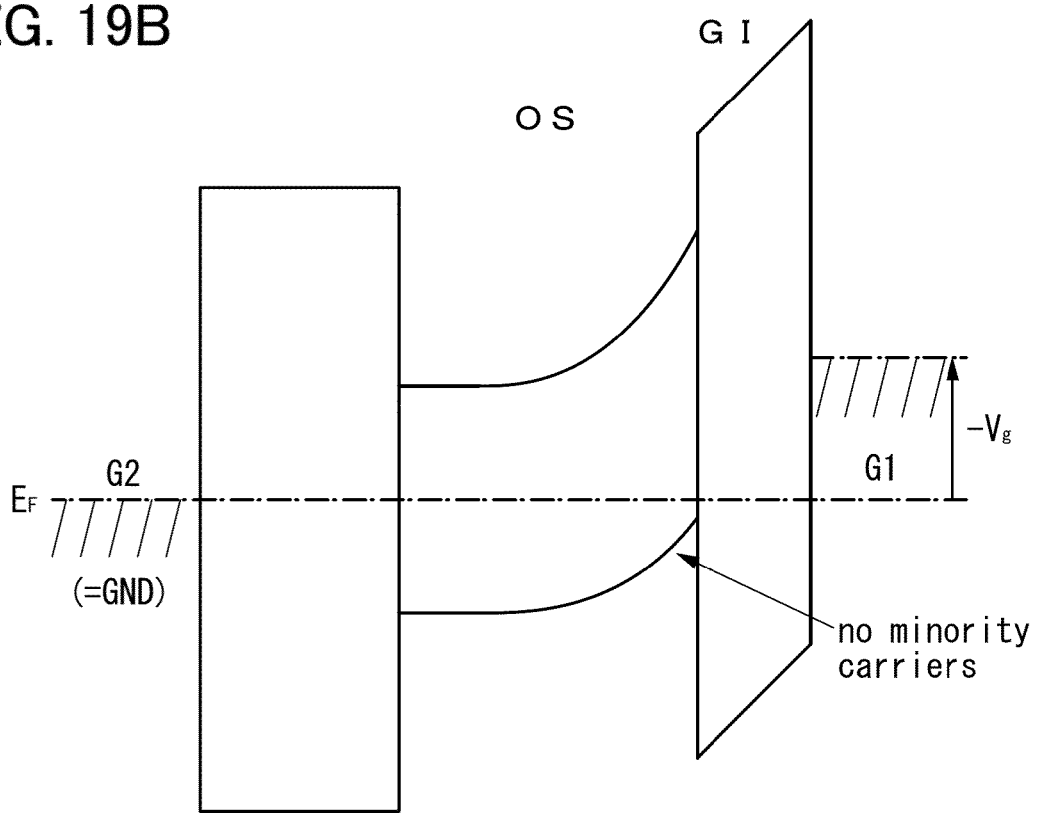

FIGS. 19A and 19B are energy band diagrams (schematic diagrams) on B-B' in FIG. 17. FIG. 19A shows a state where a positive potential ($+V_g$) is applied to a gate (G1), that is, a case where the thin film transistor is in an on-state where carriers (electrons) flow between the source and the drain. FIG. 19B shows a state where a negative potential ($-V_g$) is applied to the gate (G1), that is, a case where the thin film transistor is in an off-state (where minority carriers do not flow).

Figure 20:
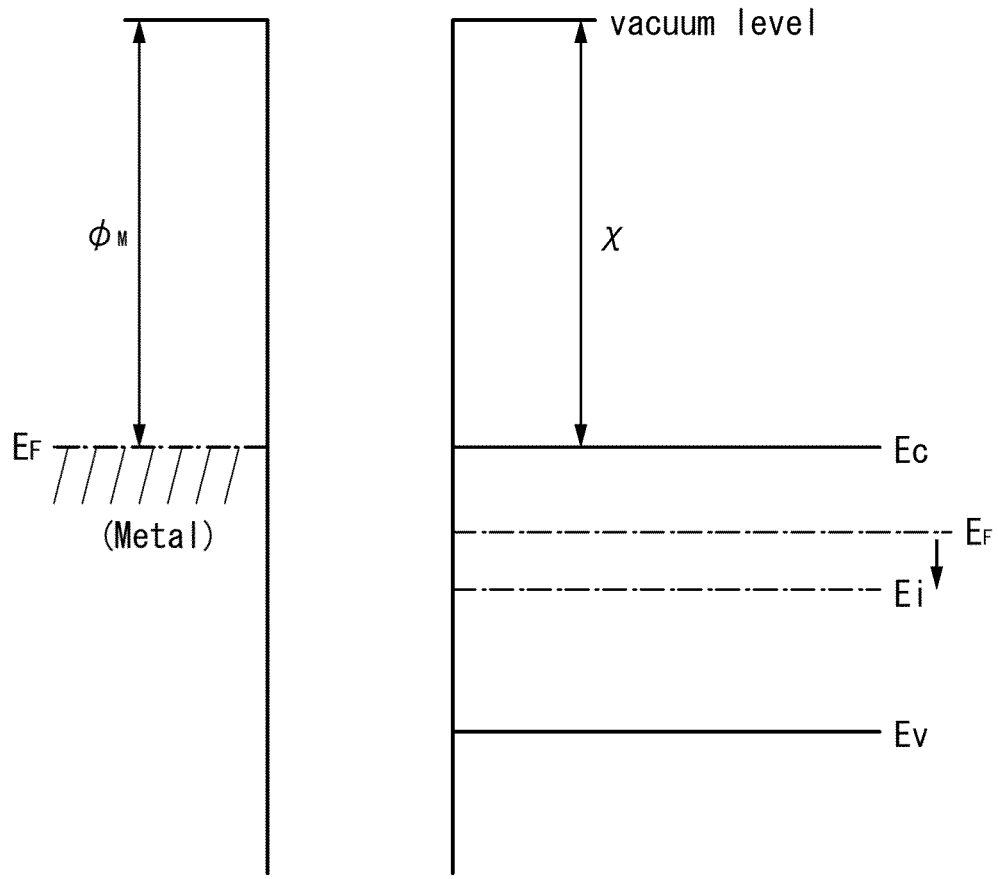
FIG. 20 is a diagram illustrating a relation between a vacuum level and a work function of a metal ($\phi_M$), and a relation between a vacuum level and an electron affinity of an oxide semiconductor ($\chi$).

FIG. 20 shows relation between the vacuum level and the work function of a metal ($\phi_M$) and relation between the vacuum level and the electron affinity of an oxide semiconductor ($\chi$).

Electrons in a metal are degenerated at room temperature, so that the Fermi level is located in the conduction band. In contrast, a conventional oxide semiconductor is generally of n-type, and the Fermi level ($E_F$) in that case is located closer to the conduction band and is away from the intrinsic Fermi level ($E_i$) that is located in the middle of the band gap. It is known that the n-type semiconductor is formed partly because some of hydrogen in the oxide semiconductor serves as donors.

In contrast, the oxide semiconductor of this embodiment is an oxide semiconductor that is made to be an intrinsic (i-type) semiconductor or made to be as close to an intrinsic semiconductor as possible by being highly purified by removal of hydrogen that is an n-type impurity so that as few impurities, which are not main components of the oxide semiconductor, as possible are contained. In other words, the oxide semiconductor of this embodiment has a feature in that it is made to be an i-type (intrinsic) semiconductor or made to be close thereto by being highly purified by removal of as many impurities such as hydrogen or water as possible, instead of addition of impurities. As a result, the Fermi level ($E_F$) can be the same level as the intrinsic Fermi level ($E_i$).

It is said that the electron affinity ($\chi$) of an oxide semiconductor is 4.3 eV in the case where the band gap ($E_g$) thereof is 3.15 eV. The work function of titanium (Ti) used for forming the source and drain electrodes is substantially equal to the electron affinity of the oxide semiconductor ($\chi$). In this case, the Schottky electron barrier is not formed at an interface between the metal and the oxide semiconductor.

In other words, an energy band diagram (a schematic diagram) like FIG. 18A is obtained in the case where a metal and an oxide semiconductor are in contact with each other when the work function of the metal ($\phi_M$) and the electron affinity of the oxide semiconductor ($\chi$) are substantially equal.

In FIG. 18B, black circles (●) represent electrons. A dashed line indicates a case where a positive voltage is applied to a gate ($V_g>0$) in the state where a positive potential is given to a drain. When no voltage is applied to the gate, carriers (electrons) are not injected from an electrode to an oxide semiconductor side due to a high potential barrier, resulting in an off-state in which no current flows. In contrast, when a positive voltage is applied to the gate, the potential barrier is reduced, resulting in an on-state in which current flows.

In this case, as shown in FIG. 19A, the electron moves along the lowest part of the oxide semiconductor, which is energetically stable, at an interface between the gate insulating film and the highly-purified oxide semiconductor.

In FIG. 19B, when a negative potential is applied to the gate (G1), the number of holes that are minority carriers is substantially zero; thus, the current value becomes a value extremely close to zero.

For example, even when the thin film transistor has a channel width W of $1\times10^4$ μm and a channel length of 3 μm, an off-state current of $10^{-13}$ A or lower and a subthreshold swing (S value) of 0.1 V/dec. (the thickness of the gate insulating film: 100 nm) can be obtained.

As described above, the oxide semiconductor is highly purified so that the amount of impurities that are not main components of the oxide semiconductor are minimized, whereby favorable operation of the thin film transistor can be obtained. In particular, the off-state current can be decreased.

Embodiment 8

In this embodiment, described is a central processing unit (CPU) to which the semiconductor device described in Embodiment 1, which is one embodiment of the present invention, is applied.

Figure 21:
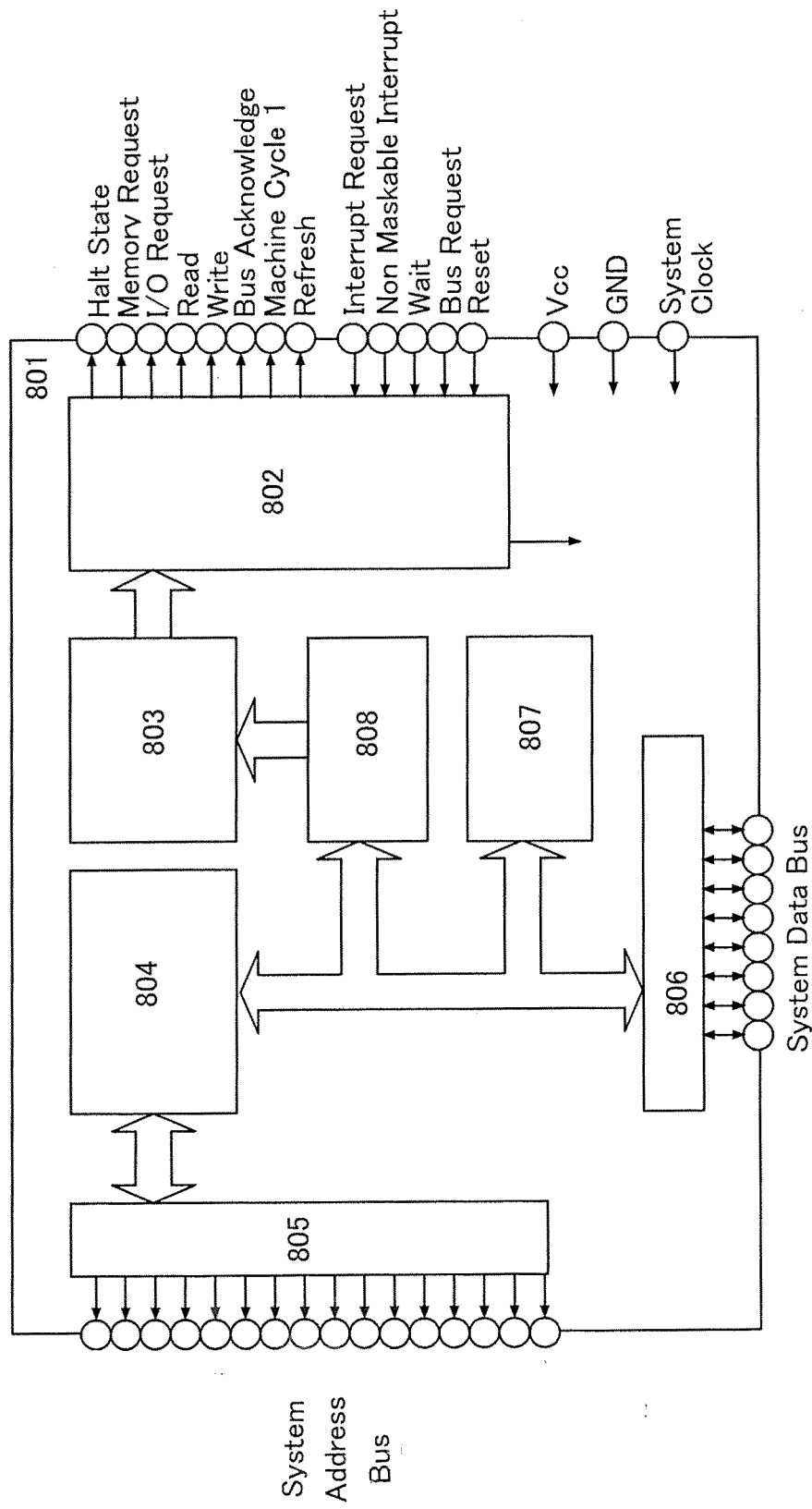
FIG. 21 illustrates a CPU which is one embodiment of the present invention.

An example of a block diagram of a CPU is illustrated in FIG. 21. A CPU 801 illustrated in FIG. 21 includes a timing control circuit 802, an instruction decoder 803, a register array 804, an address logic and buffer circuit 805, a data bus interface 806, an ALU (an arithmetic logic unit) 807, an instruction register 808, and the like.

These circuits included in the CPU 801 can be manufactured using the transistor described in any of Embodiments 1 to 7. The transistors described in Embodiments 1 to 7 each use an oxide semiconductor layer, whereby field-effect mobility can be increased. In addition, when hydrogen concentration is sufficiently reduced, the off-state current of the transistor can be extremely small. By using a transistor including an oxide semiconductor layer with sufficiently reduced hydrogen concentration for at least part of the CPU 801, the power consumption of the central processing unit can be reduced.

Now, each circuit included in the CPU 801 is briefly described.

The timing control circuit 802 receives an instruction from the external, converts the instruction into information for the internal, and sends the information to other blocks. In addition, the timing control circuit gives directions such as reading and writing of memory data to the external, according to internal operation.

The instruction decoder 803 serves to convert instruction from the external into instruction for the internal.

The register array 804 has a function of temporarily storing data. Therefore, it includes a memory element.

The address logic and buffer circuit 805 has a function of specifying the address of an external memory.

The data bus interface 806 has a function of taking data in and out of an external memory or a device such as a printer.

The ALU 807 has a function of performing an operation.

The instruction register 808 has a function of temporarily storing an instruction. Therefore, it includes a memory element.

By using any of the transistors described in Embodiments 1 to 7 for at least part of the CPU 801, leakage current is reduced; thus, power consumption in a standby period (standby power) is reduced. Therefore, power consumption of such central processing unit can be reduced. The memory element described in Embodiment 1, for example, can be particularly applied to a memory element included in the register array 804 or the command register 808 among circuits included in the CPU 801.

This embodiment can be freely combined with any of the other embodiments.

Embodiment 9

In this embodiment, a semiconductor device which is one embodiment of the present invention is described. As an example of a semiconductor device to which the transistor described in any of Embodiment 1 to Embodiment 7 is applied, a wireless communication semiconductor device capable of input/output data without contact is described. The wireless communication semiconductor device capable of input/output data without contact is also called an RFID tag, an ID tag, an IC tag, an RF tag, a wireless tag, an electronic tag, or a wireless chip.

One example of a structure of the wireless communication semiconductor device of this embodiment is described with reference to FIGS. 22A to 22C. The wireless communication semiconductor device illustrated in FIG. 22A includes a semiconductor integrated circuit chip 900 having an antenna (also referred to as an on-chip antenna) and a supporting substrate 904 having an antenna 902 (also referred to as a booster antenna). The semiconductor integrated circuit chip 900 is provided over an insulating layer 908 formed over the supporting substrate 904 and the antenna 902. The insulating layer 908 may be formed by a sealant or the like as long as it can fix the semiconductor integrated circuit chip 900 to the supporting substrate 904 and the antenna 902.

Note that a conductive shield is preferably provided on a surface of the semiconductor integrated circuit chip 900 to prevent electrostatic breakdown of the semiconductor integrated circuit (e.g., malfunction of the circuit and damage to a semiconductor element) due to electrostatic discharge. Note that when the conductive shield has high resistance and current cannot pass through the pattern of the antenna 902, the antenna 902 and the conductive shield provided on the surface of the semiconductor integrated circuit chip 900 may be provided in contact with each other.

A semiconductor integrated circuit provided in the semiconductor integrated circuit chip 900 includes a plurality of elements such as transistors constituting a memory portion or a logic portion. As a transistor for constituting a memory portion or a logic portion, a transistor described in any of Embodiments 1 to 7 can be used.

Figure 22A:
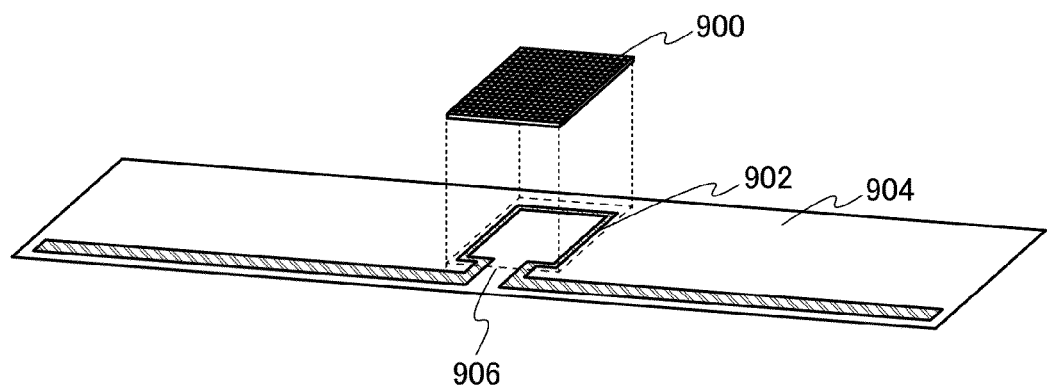
FIGS. 22A to 22C illustrate a wireless communication semiconductor device which is one embodiment of the present invention.
Figure 22B:
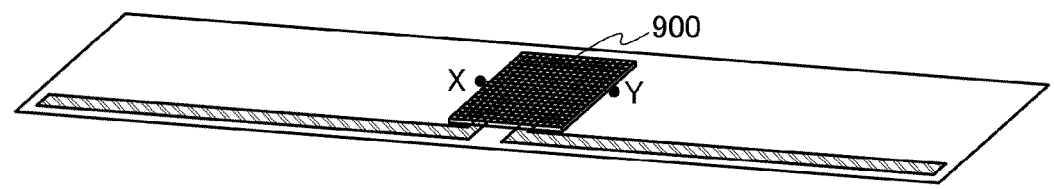
Figure 23A:
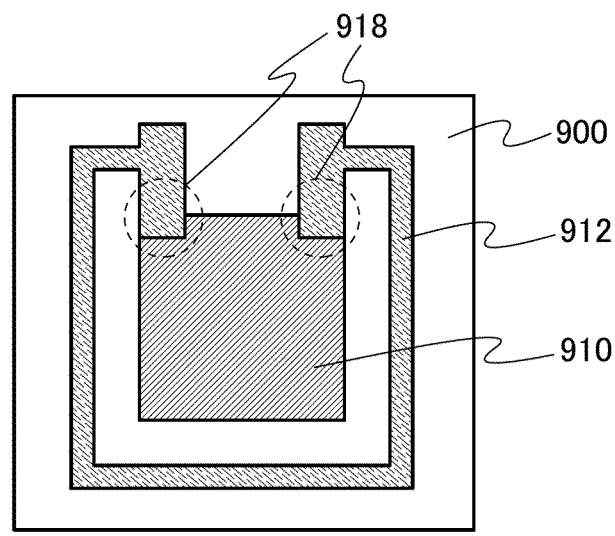
FIGS. 23A and 23B each illustrate a wireless communication semiconductor device which is one embodiment of the present invention.

FIG. 23A is an enlarged view of the antenna (the on-chip antenna) and the semiconductor integrated circuit included in the semiconductor integrated circuit chip 900 illustrated in FIG. 22A. Although the antenna 912 is a rectangular loop antenna with one winding in FIG. 23A, the present invention is not limited to this structure. The shape of the antenna 912 may be a shape with curve (e.g., a circle), and the number of windings of the antenna 912 may be plural. However, the number of windings of the antenna 912 is preferably 1, in which case parasitic capacitance generated between the semiconductor integrated circuit 910 and the antenna 912 can be reduced.

Figure 23B:
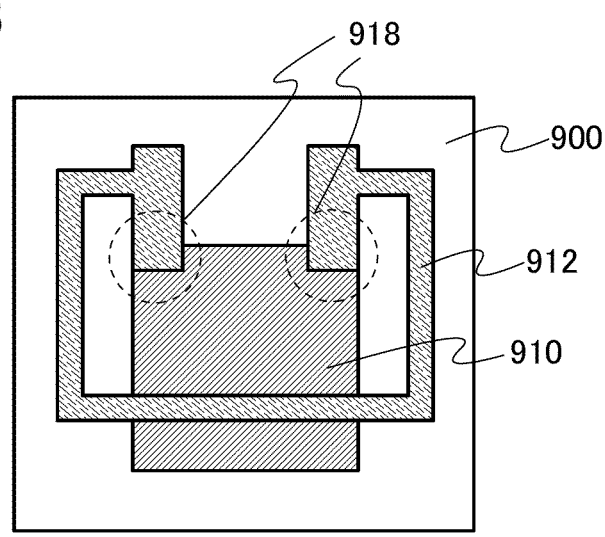

In FIG. 23A, the antenna 912 is placed to surround the periphery of the semiconductor integrated circuit 910, and except for a portion corresponding to power feeding points 918 indicated by dashed lines, the antenna 912 is arranged in a region that does not overlap with the semiconductor integrated circuit 910. When the antenna 912 and the semiconductor integrated circuit 910 are placed in different regions as illustrated in FIG. 23A, the parasitic capacitance between the semiconductor integrated circuit 910 and the antenna 912 can be reduced. However, the present invention is not limited to this structure. As shown in FIG. 23B, the antenna 912 may be provided so as to at least partly overlap with the semiconductor integrated circuit 910 except for the portions which correspond to the power feeding points 918.

In FIG. 22A, the antenna 902 can send and receive signals or supply power to/from the antenna 912 included in the semiconductor integrated circuit chip 900 by electromagnetic induction mainly in a loop-shaped portion surrounded by a dashed line 906. In addition, the antenna 902 can send and receive a signal to/from an external interrogator by using a radio wave mainly in a region other than a portion surrounded by a dashed line 906. In addition to sending and receiving a signal, supplying electric power may be performed by the external interrogator. Although there is no particular limitation, it is preferable that the frequency of a radio wave used as a carrier (carrier wave) between the interrogator and the semiconductor integrated circuit chip 900 be approximately more than or equal to 30 MHz and less than or equal to 5 GHz; for example, a frequency band of 950 MHz, 2.45 GHz, or the like may be employed.

Although the antenna 902 is a rectangular loop antenna in which the number of windings is 1 in the portion surrounded by the dashed line 906, an embodiment of the present invention is not limited to this structure. The shape of the antenna 902 may be a shape with curve (e.g., a circle). In addition, the number of windings may be plural. However, when the number of windings of the antenna 902 is preferably 1 in the portion surrounded by the dashed line 906, in which case parasitic capacitance generated between the antenna 902 and the antenna 912 can be reduced.

There is no particular limitation on communication methods of the wireless communication semiconductor device of this embodiment; for example, an electromagnetic induction method, an electromagnetic coupling method, or a microwave method can be used. In the case of using a microwave method (for example, using a UHF band (a band of 860 MHz to 960 MHz), a 2.45 GHz band, or the like), the length and shape of the antennas 902 and 912 may be decided depending on the wavelength of electromagnetic wave used. The antennas can have a linear shape (e.g., a dipole antenna), a flat shape (e.g., a patch antenna or an antenna having a ribbon shape), or the like, instead of the above-described shapes. The antenna may have a serpentine curved shape, or a shape combining them instead of the above-described shapes.

Figure 24:
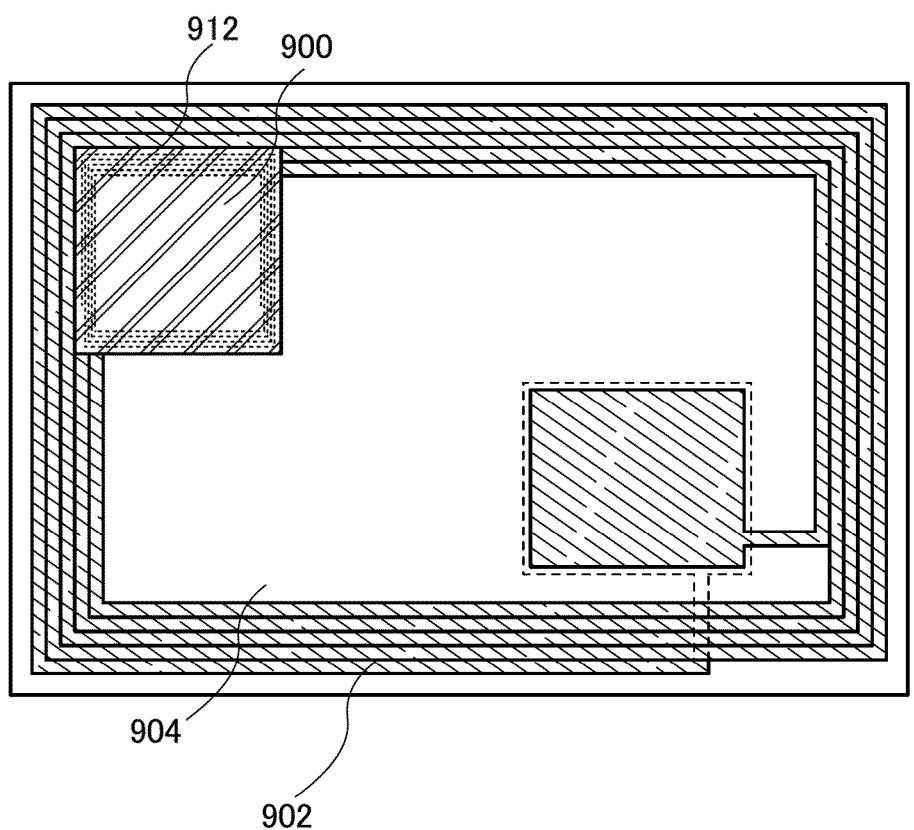
FIG. 24 illustrates a wireless communication semiconductor device which is one embodiment of the present invention.

The communication method of the wireless communication semiconductor device of this embodiment may be an electromagnetic induction method or an electromagnetic coupling method, as described above. FIG. 24 illustrates an example in which the electromagnetic induction method or the electromagnetic coupling method is used.

In FIG. 24, the coil antenna 902 is provided as a booster antenna over the supporting substrate 904, and the semiconductor integrated circuit chip 900 including the coil antenna 912 is provided over the supporting substrate 904.

Next, the structures and arrangements of the semiconductor integrated circuit chip 900 and the booster antenna are described. FIG. 22B is a perspective view of a semiconductor device in which the semiconductor integrated circuit chip 900 and the antenna 902 provided for the support substrate 904 illustrated in FIG. 22A are stacked. FIG. 22C corresponds to a cross-sectional view taken along dashed line X-Y of FIG. 22B.

Figure 22C:
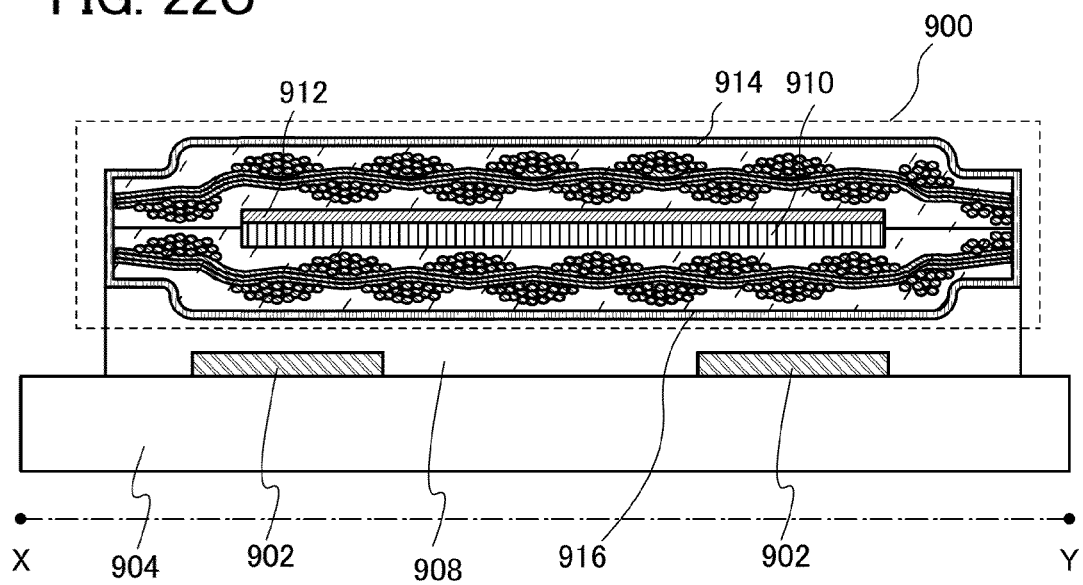

The semiconductor integrated circuit 910 illustrated in FIG. 22C is held between a first insulator 914 and a second insulator 916, and the side surfaces thereof are also sealed. In this embodiment, a first insulator and a second insulator between which a plurality of semiconductor integrated circuits are interposed are attached, and then the semiconductor integrated circuits may be individually divided into stacks. A conductive shield is formed each for the divided stacks, and the semiconductor integrated circuit chips 900 are formed. There is no particular limitation on a separation means as long as physical separation is possible, and separation is performed by laser beam irradiation for example.

In FIG. 22C, the semiconductor integrated circuit 910 is closer to the antenna 902 than the antenna 912; however, the present invention is not limited to this structure. The antenna 912 may be closer to the antenna 902 than the semiconductor integrated circuit 910.

Figure 25:
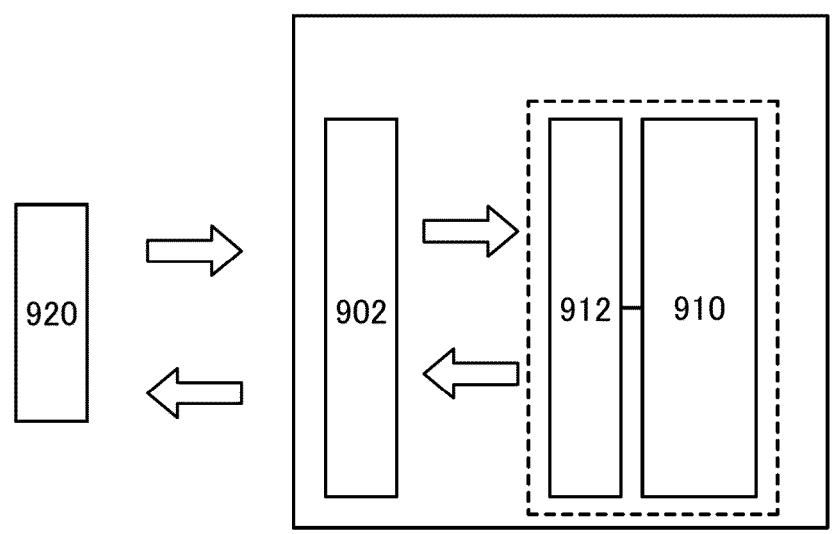
FIG. 25 illustrates a wireless communication semiconductor device which is one embodiment of the present invention.
Figure 26E:
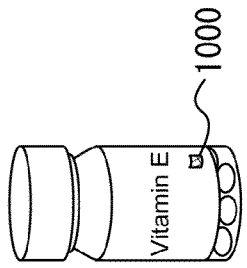
FIGS. 26A to 26F each illustrate an application example of a wireless communication semiconductor device which is one embodiment of the present invention.
Figure 26F:
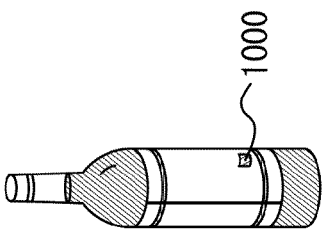
Figure 26C:
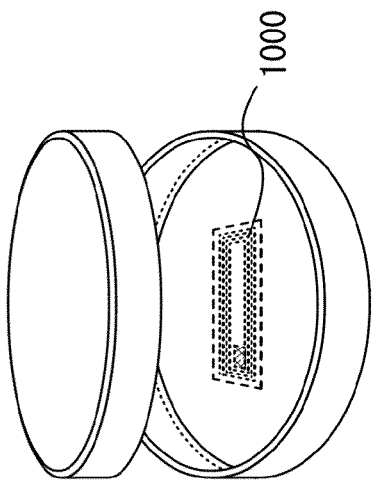
Figure 26D:
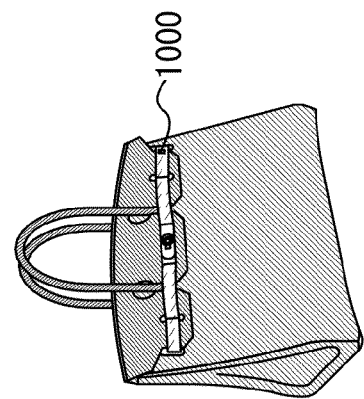
Figure 26A:
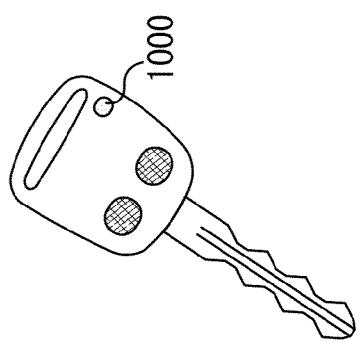
Figure 26B:
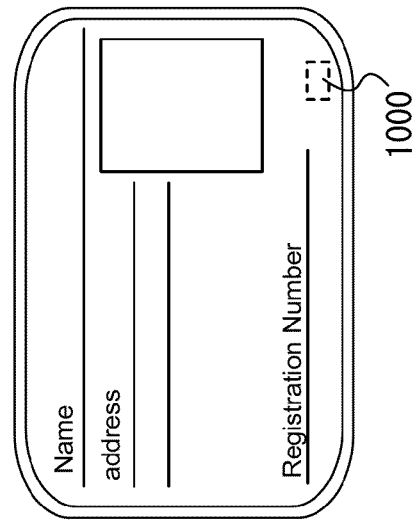

Next, operation of the wireless communication semiconductor device of this embodiment is briefly described below. FIG. 25 is a block diagram illustrating an example of a structure of the wireless communication semiconductor device of this embodiment. The portions that are the same as those in FIGS. 22A, 22B, and 22C, FIGS. 23A and 23B, and FIG. 24 are denoted by the same reference numerals. The wireless communication semiconductor device illustrated in FIG. 25 includes the antenna 902, the semiconductor integrated circuit 910, and the antenna 912. The antenna 902 is a booster antenna, and the antenna 912 is an on-chip antenna.

First, the case where the wireless communication semiconductor device receives signals and electric power from the interrogator 920 is described. First, when an electromagnetic wave is sent from the interrogator 920, the antenna 902 receives the electromagnetic wave, whereby alternating current is generated in the antenna 902 and a magnetic field is generated around the antenna 902. Then, a loop-shaped portion included in the antenna 902 and the antenna 912 having a loop shape are electromagnetically coupled, and induced electromotive force is generated in the antenna 912. The semiconductor integrated circuit 910 receives a signal or power from the interrogator 920 by using the induced electromotive force.

Then, the case where the wireless communication semiconductor device sends signals to the interrogator 920 is described. At this time, current is made to flow through the antenna 912 and induced electromotive force is generated in the antenna 902 in accordance with a signal generated in the semiconductor integrated circuit 910, whereby the signal can be transmitted to the interrogator 920 as a reflected wave of a radio wave transmitted from the interrogator 920.

Note that the antenna 902 can mainly be divided into a loop-shaped portion which is coupled electromagnetically with the antenna 912 and a portion which receives a radio wave from the interrogator 920. The shape of the antenna 902 in the portion in which an electric wave from the interrogator 920 is mainly received may be a shape in which an electric wave can be received. For example, shapes such as a dipole antenna, a folded-dipole antenna, a slot antenna, a meander line antenna, or a microstrip antenna may be used.

Although the case where one on-chip antenna and one booster antenna are included is described above, there is no limitation to this case. An antenna for electric power and an antenna for sending and receiving signals may be separately formed. By separately forming the antenna for electric power and the antenna for sending and receiving signals, it is possible to vary the frequency of the radio wave for supplying electric power and the frequency of the radio wave for sending signals; as a result, electric power can be supplied efficiently and signals can be sent and received efficiently.

In a semiconductor device of this embodiment, the on-chip antenna is used and a signal or power can be sent and received between the booster antenna and the on-chip antenna without contact; therefore, unlike the case where a semiconductor integrated circuit is physically in direct connection to an external antenna, the semiconductor integrated circuit and the antenna are less likely to be disconnected due to external force, and generation of initial failure in the connection can also be suppressed.

In addition, since the booster antenna is used in the semiconductor device of this embodiment, unlike the case where only the on-chip antenna is used, the area of the semiconductor integrated circuit does not significantly limit the size or shape of the on-chip antenna. Accordingly, there is no limitation on the frequency band of radio waves capable of being received, and the communication distance can be longer than that of the semiconductor device using only the on-chip antenna.

The semiconductor integrated circuit of this embodiment may be formed over a flexible substrate. In the case of using a flexible substrate, the semiconductor integrated circuit may be formed directly on the flexible substrate, or may be formed on another substrate such as a glass substrate for formation of the semiconductor integrated circuit, and then transferred to a flexible substrate such as a plastic substrate. There is no particular limitation on the method of transferring the semiconductor integrated circuit from the formation substrate to a flexible substrate; for example, a separation layer may be formed between the formation substrate and the semiconductor integrated circuit.

In the case where the semiconductor integrated circuit is transferred to a flexible substrate, the separation layer can be formed using, for example, a metal oxide. In this case, the formed metal oxide is weakened by crystallization, and an element layer including the semiconductor integrated circuit, which is a layer to be separated, can be separated from the formation substrate. After the metal oxide film is crystallized, part of the separation layer may be removed with use of a solution or a halogen fluoride gas such as $NF_3$, $BrF_3$, or $ClF_3$, and then separation may be performed.

In addition, when a substrate having a light-transmitting property is used as the formation substrate and a film containing nitrogen, oxygen, hydrogen or the like (e.g., an amorphous silicon film containing hydrogen, an alloy film containing hydrogen, an alloy film containing oxygen or the like) is used as the separation layer, the separation layer is irradiated with laser light through the formation substrate, and nitrogen, oxygen, or hydrogen contained in the separation layer is evaporated so that separation can occur.

Alternatively, a method of removing the formation substrate mechanically (e.g., grinding) or a method of removing the formation substrate chemically (e.g., etching using any of the above-described halogen fluoride gases) may be employed. In this case, the separation layer is not necessarily used.

Alternatively, laser irradiation, a sharp knife, or the like can be used so as to form a groove to expose the separation layer and the separation may be performed by using the groove as a trigger.

When the above-described separation is performed, for example, mechanical force may be applied. As a method for applying the mechanical force, for example, a separation process with a human hand or with a gripper, a separation process by rotation of a roller, or the like can be given.

Note that the separation layer can be formed using tungsten, for example. When the separation layer is formed using tungsten, separation can be performed while the separation layer is being etched by a mixed solution of ammonia water and hydrogen peroxide solution.

The transistors described in Embodiments 1 to 7 have a small off-state current; therefore, by applying any of the transistors to the semiconductor device of this embodiment, low power consumption can be realized.

By the conductive shields covering the semiconductor integrated circuit, electrostatic breakdown of the semiconductor integrated circuit can be prevented.

With a pair of insulators between which the semiconductor integrated circuit is interposed, a highly reliable semiconductor device while achieving reduction in thickness and size can be provided.

Accordingly, a highly reliable semiconductor device with low power consumption in which electrostatic discharge is suppressed can be obtained.

This embodiment can be freely combined with any of the other embodiments.

Embodiment 10

In this embodiment, examples in each of which the wireless communication semiconductor device described in Embodiment 9 is used as one embodiment of the present invention are described.

FIGS. 26A to 26F illustrate application examples of a semiconductor device 1000 which is similar to the wireless communication semiconductor device described in Embodiment 9. The semiconductor device 1000 can be used for a variety of items and systems by utilizing a function of sending and receiving an electromagnetic wave. As the items, the following items are given: keys (see FIG. 26A), paper money, coins, securities, bearer bonds, certificates (such as a driver's license or a resident's card, see FIG. 26B), books, containers (such as a Petri dish, see FIG. 26C), personal accessories (such as bags or eyeglasses, see FIG. 26D), packaging containers (such as wrapping paper or bottles, see FIGS. 26E and 26F), recording media (such as a disk or video tape), vehicles (such as a bicycle), food, clothing, livingware, electronic appliances (such as a liquid crystal display device, an EL display device, a television device, or a portable terminal), and the like. The semiconductor device 1000 is fixed to such items having a variety of shapes by being attached to or embedded in a surface. As the systems, a goods management system, an authentication function system, a distribution system, and the like can be given.

By using a highly reliable semiconductor device with low power consumption in which electrostatic discharge is suppressed, a highly reliable system can be obtained.

This embodiment can be freely combined with any of the other embodiments.

Embodiment 11

In this embodiment, described is a display device to which the transistor described in any one of Embodiments 1 to 7 is applied.

Although the display device of this embodiment may be a liquid crystal display device or an EL display device, an example of an electric paper using an electrophoretic element is described here.

Figure 27A:
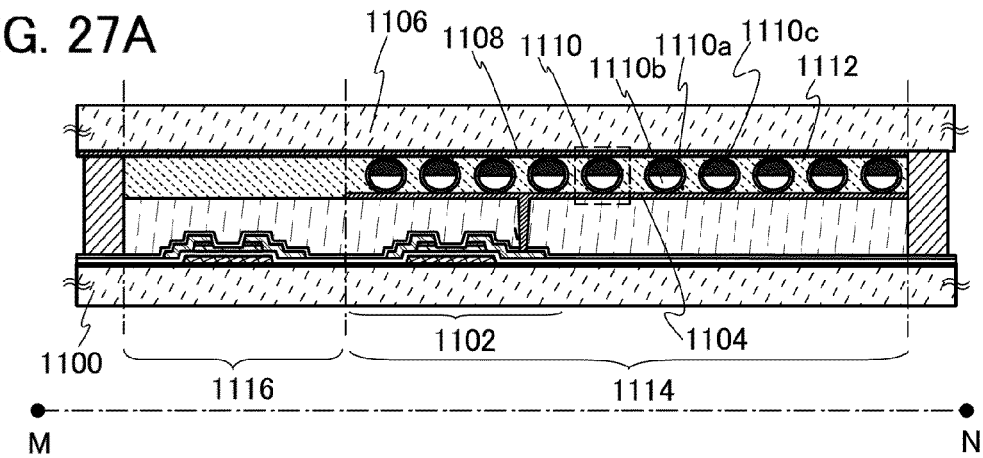
FIGS. 27A to 27C each illustrate an example of a display device which is one embodiment of the present invention.
Figure 27B:
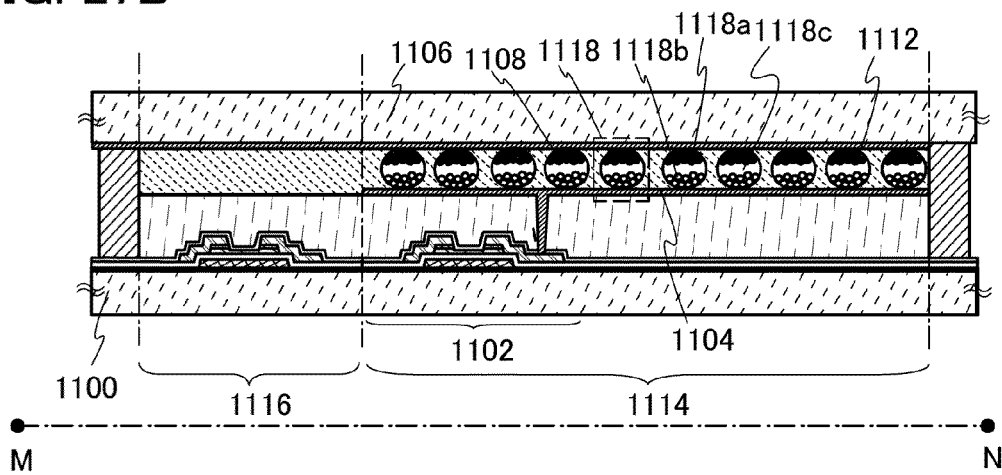
Figure 27C:
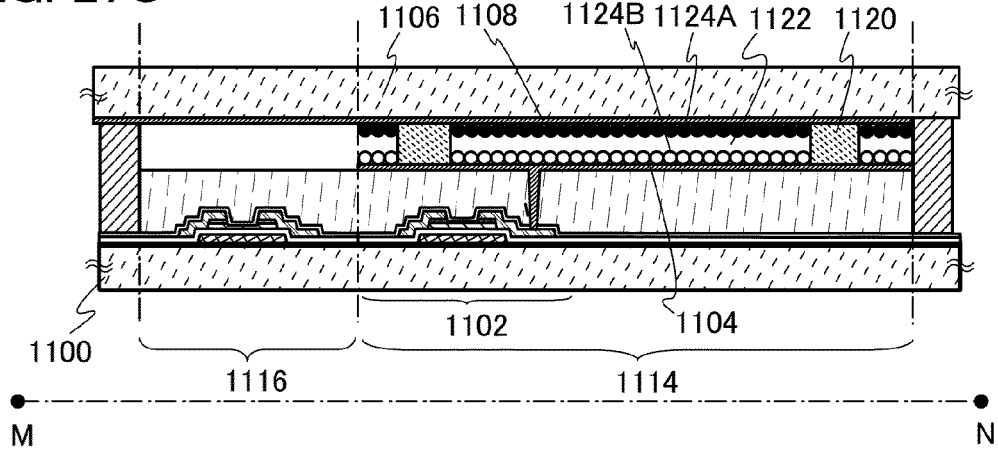

FIGS. 27A to 27C illustrate cross-sectional views in which an active matrix electronic paper is used as a display panel. The electronic paper has visibility as high as paper, consumes lower power than other display panels, and can be made thin and lightweight.

FIG. 27A is a cross-sectional view of an electronic paper using a twist ball method. The twist ball method is a method in which spherical particles each colored in black and white are arranged between electrode layers included in a display element and the orientation of the spherical particles is controlled with the use of a voltage between the electrode layers to display an image.

The electronic paper using the twist ball method which is illustrated in FIG. 27A includes a display portion 1114 and a driver circuit portion 1116. The display portion 1114 includes a first electrode layer 1104 connected to a transistor 1102 over a substrate 1100, a second electrode layer 1108 provided over a substrate 1106, and spherical particles 1110 arranged between the first electrode layer 1104 and the second electrode layer 1108. The spherical particles 1110 each include a black region 1110a, a white region 1110b, and a cavity 1110c filled with a liquid around the black region and the white region. A space around the spherical particles 1110 is filled with a filler 1112 such as an organic resin. The second electrode layer 1108 corresponds to a common electrode (a counter electrode) and is electrically connected to a common potential line. Note that the driver circuit portion 1116 includes a transistor formed through the same process as the transistor 1102 in the display portion 1114.

FIG. 27B is a cross-sectional view of an electronic paper using the electrophoretic element method. In FIG. 27B, microcapsules 1118 are used instead of the spherical particles 1110 in FIG. 27A. The microcapsules 1118 each include a transparent liquid 1118c, a negatively charged black particle 1118a, and a positively charged white particle 1118b. Each of the microcapsules 1118 has a diameter of approximately 10 µm to 200 µm.

In the microcapsules 1118 provided between the first electrode layer 1104 and the second electrode layer 1108, when an electric field is generated by the first electrode layer 1104 and the second electrode layer 1108, the white particles 1118b as first particles and the black particles 1118a as second particles move in opposite directions, so that white or black can be displayed. A display element using this principle is an electrophoretic display element. The electrophoretic display element has high reflectivity, and thus, an auxiliary light is unnecessary, power consumption is low, and high visibility is provided even in a dim place. Moreover, an image which has been displayed once can be retained even when no power is supplied to the display portion.

Note that the first particles and the second particles each include a pigment, and do not move when there is no potential gradient. The colors of the first particles and the second particles are not limited to black and white, and any color may be used for the first particles and the second particles as long as the colors of the first particles and the second particles are different from each other (the colors include achromatic color).

A solution in which the aforementioned microcapsules are dispersed in a solvent is referred to as electronic ink. The electronic ink can be printed on a surface of glass, plastic, cloth, paper, or the like. Furthermore, by using a color filter or particles that have a pigment, color display can also be achieved.

Note that the first particles and the second particles in the microcapsules 1118 may be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

FIG. 27C is a cross-sectional view of an electronic paper using a method using an electronic powder and grain. Positively charged black liquid powder 1124A and negatively charged white liquid powder 1124B are contained in a space 1122 surrounded by the first electrode layer 1104, the second electrode layer 1108, and a rib 1120. The space 1122 may be filled with the air, for example.

With a potential gradient generated by the first electrode layer 1104 and the second electrode layer 1108, the black liquid powder 1124A and the white liquid powder 1124B move in opposite directions, so that white or black can be displayed. As the liquid powders, color powders of red, yellow, and/or blue may be used.

In FIGS. 27A to 27C, a light-transmitting plastic substrate or the like can be used as the substrate 1100. Note that, as the plastic substrate, a fiberglass-reinforced plastics (FRP) plate, a polyvinyl fluoride (PVF) film, a polyester film, or an acrylic resin film can be used, for example. Alternatively, a sheet in which aluminum foil is interposed between PVF films or polyester films can be used.

When a plastic substrate or the like is used for the substrate 1100, for example, a separation layer is formed over a glass substrate, an element is formed over the separation layer, an upper surface of the element is bonded to a different substrate, and the separation layer is removed, so that the element may be transferred to the plastic substrate from the different substrate. Note that, for example, tungsten oxide can be used for the separation layer. It is preferable to form the separation layer using tungsten oxide because separation can be performed using water. Note that the different substrate described above may also be a plastic substrate.

With this embodiment, a transistor having high field-effect mobility can be formed over a large substrate, and a driver circuit and a pixel circuit can be formed over one substrate; therefore, a high value-added electronic paper which is, for example, capable of double-frame rate driving can be provided.

In this embodiment, an example of an electronic paper formed using an electrophoretic element or the like which is one embodiment of the present invention is described; however, one embodiment of the present invention is not limited to this, and an electronic paper of another mode may be used. For example, an electronic paper in which a liquid crystal element or an EL element is used for a display element may be used.

This embodiment can be freely combined with any of the other embodiments and carried out.

Embodiment 12

In this embodiment, described are electronic devices each of which is one embodiment of the present invention including a display portion to which the display device described in Embodiment 11 is applied.

As examples of the electronic devices to which the display device in Embodiment 11 is applied in a display portion, the following can be given: cameras such as video cameras and digital cameras, goggle type displays, navigation systems, audio replay devices (e.g., car audio systems and audio systems), computers, game machines, portable information terminals (e.g., mobile computers, cellular phones, portable game machines, and electronic book readers), image replay devices in which a recording medium is provided (specifically, devices that are capable of replaying recording media such as digital versatile discs (DVDs) and equipped with a display device that can display an image), and the like.

Figure 28A:
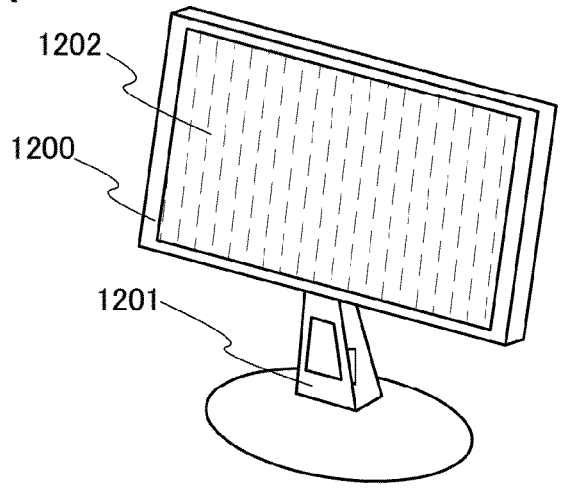
FIGS. 28A to 28C each illustrate an example of an electronic appliance which is one embodiment of the present invention.

The display illustrated in FIG. 28A includes a housing 1200, a support base 1201, and a display portion 1202, and has a function of displaying a variety of input information (e.g., still images, moving images, and text images) on the display portion 1202. Note that the function included in the display illustrated in FIG. 28A is not limited to this, and for example, the display can be provided with a speaker, and the display may be a touch panel through which information can be not only displayed but input.

Figure 28B:
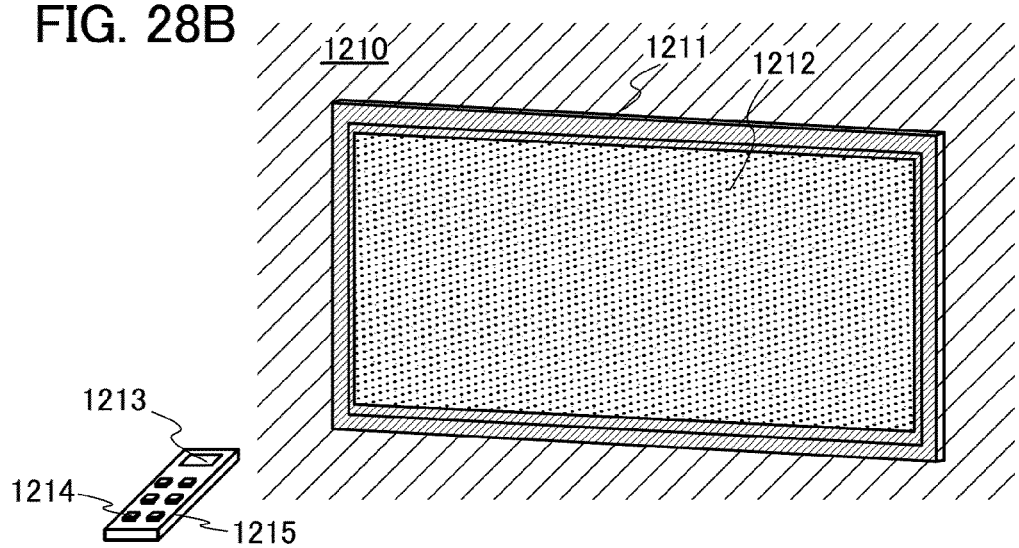

In the television set illustrated in FIG. 28B, a display portion 1212 is incorporated in a housing 1211. The display portion 1212 can display images. In addition, the structure in which the rear side of the housing is supported by fixing to a wall 1210 is illustrated here.

The television set illustrated in FIG. 28B can be operated by an operation switch of the housing 1211 or a remote controller 1215. The channel and volume can be controlled with operation keys 1214 of the remote controller 1215 and the images displayed in the display portion 1212 can be controlled. Furthermore, the remote controller 1215 may be provided with a display portion 1213 for displaying data output from the remote controller 1215.

Note that the television set illustrated in FIG. 28B is provided with a receiver, a modem, and the like. With the receiver, a general television broadcast can be received. Moreover, when the display device is connected to a communication network with or without wires via the modem, one-way (from a sender to a receiver) or two-way (between a sender and a receiver or between receivers) information communication can be performed.

Figure 28C:
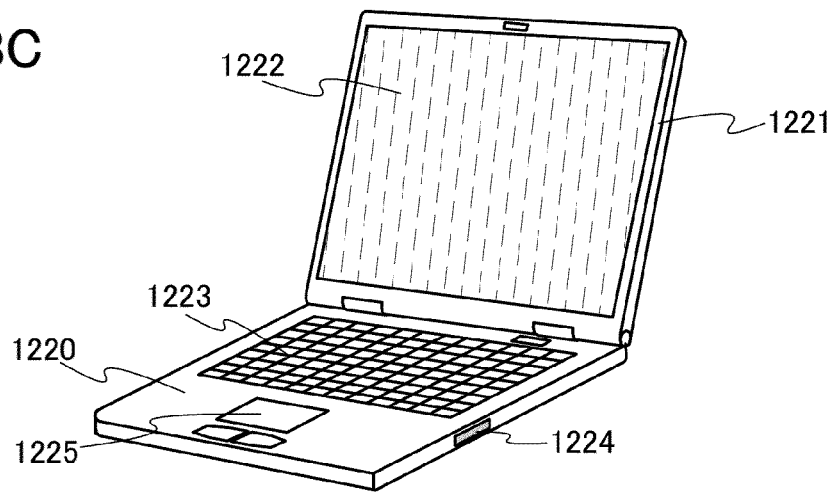

The computer illustrated in FIG. 28C includes a main body 1220, a housing 1221, a display portion 1222, a keyboard 1223, an external connection port 1224, and a pointing device 1225, and has a function of displaying a variety of information (e.g., still images, moving images, and text images) on the display portion 1222. Note that the computer illustrated in FIG. 28C is not limited to this function, and for example, may include a function of a touch panel which can input information as well as displaying information.

By using the semiconductor device described in Embodiment 1 in a memory portion of each of the electronic devices described in this embodiment, electronic devices with high reliability and low power consumption can be obtained.

By using the display device described in Embodiment 11 in a display portion of each of the electronic devices described in this embodiment, electronic devices with high reliability and low power consumption can be obtained. Accordingly, the aperture ratio can be improved.

This embodiment can be freely combined with any of the other embodiments and carried out.

This application is based on Japanese Patent Application serial no. 2009-242871 filed with Japan Patent Office on Oct. 21, 2009, the entire contents of which are hereby incorporated by reference.

The invention claimed is:

1. A memory device comprising:
a memory element comprising a transistor,
the transistor comprising:
    a crystalline oxide semiconductor layer including a channel formation region and comprising oxygen, indium, zinc and a metal other than indium and zinc; and
    a gate electrode layer over the channel formation region with an insulating film interposed therebetween,
wherein a hydrogen concentration in the crystalline oxide semiconductor layer is less than or equal to $5 \times 10^{19}$ cm$^{-3}$, and
wherein a value of off-state current through the crystalline oxide semiconductor layer of the transistor is less than or equal to $1 \times 10^{-17}$ A/μm.

2. The memory device according to claim 1, wherein a carrier concentration in the crystalline oxide semiconductor layer is less than or equal to $5\times10^{14}$ cm$^{-3}$.

3. The memory device according to claim 1, wherein a degree of crystallization of the crystalline oxide semiconductor layer is more than or equal to 80%.

4. The memory device according to claim 1, wherein a width of the gate electrode layer is larger than a width of the crystalline oxide semiconductor layer in a channel width direction.

5. The memory device according to claim 1, further comprising:
a first line;
a second line; and
a capacitor,
wherein one of a source and a drain of the transistor is electrically connected to the first line,
wherein the other of the source and the drain of the transistor is electrically connected to one terminal of the capacitor,
wherein the other terminal of the capacitor is electrically connected to the second line.

6. The memory device according to claim 1, wherein the memory device is a DRAM.

7. A processor comprising:
a timing control circuit;
an instruction decoder operationally connected to the timing control circuit;
a register array;
an address logic and buffer circuit operationally connected to the register array;
a data bus interface operationally connected to the register array;
an arithmetic logic unit operationally connected to the register array; and
an instruction register operationally connected to the instruction decoder and the register array,
wherein at least one of the register array and the instruction register comprises the memory device according to claim 1.

8. The processor according to claim 7, wherein the processor is a CPU.

9. A memory device comprising:
a memory element comprising a transistor,
the transistor comprising:
a crystalline oxide semiconductor layer including a channel formation region and comprising oxygen, indium, zinc and a metal other than indium and zinc;
source and drain electrode layers over the crystalline oxide semiconductor layer;
an insulating film over the source and drain electrode layers and in contact with the crystalline oxide semiconductor layer; and
a gate electrode layer over the channel formation region with the insulating film interposed therebetween,
wherein a hydrogen concentration in the crystalline oxide semiconductor layer is less than or equal to $5\times10^{19}$ cm$^{-3}$, and
wherein a value of off-state current through the crystalline oxide semiconductor layer of the transistor is less than or equal to $1\times10^{-17}$ A/μm.

10. The memory device according to claim 9, wherein a carrier concentration in the crystalline oxide semiconductor layer is less than or equal to $5\times10^{14}$ cm$^{-3}$.

11. The memory device according to claim 9, wherein a degree of crystallization of the crystalline oxide semiconductor layer is more than or equal to 80%.

12. The memory device according to claim 9, wherein a width of the gate electrode layer is larger than a width of the crystalline oxide semiconductor layer in a channel width direction.

13. The memory device according to claim 9, wherein the memory device is a DRAM.

14. A processor comprising:
a timing control circuit;
an instruction decoder operationally connected to the timing control circuit;
a register array;
an address logic and buffer circuit operationally connected to the register array;
a data bus interface operationally connected to the register array;
an arithmetic logic unit operationally connected to the register array; and
an instruction register operationally connected to the instruction decoder and the register array,
wherein at least one of the register array and the instruction register comprises the memory device according to claim 9.

15. A memory device comprising:
a memory element comprising a transistor,
the transistor comprising:
a first gate electrode layer;
a crystalline oxide semiconductor layer over the first gate electrode layer with a first insulating film interposed therebetween, the crystalline oxide semiconductor layer including a channel formation region and comprising oxygen, indium, zinc and a metal other than indium and zinc; and
a second gate electrode layer over the channel formation region with a second insulating film interposed therebetween,
wherein the first gate electrode layer and the second gate electrode layer overlap each other with the channel formation region provided therebetween,
wherein a hydrogen concentration in the crystalline oxide semiconductor layer is less than or equal to $5\times10^{19}$ cm$^{-3}$, and
wherein a value of off-state current through the crystalline oxide semiconductor layer of the transistor is less than or equal to $1\times10^{-17}$ A/μm.

16. The memory device according to claim 15, wherein a carrier concentration in the crystalline oxide semiconductor layer is less than or equal to $5\times10^{14}$ cm$^{-3}$.

17. The memory device according to claim 15, wherein a degree of crystallization of the crystalline oxide semiconductor layer is more than or equal to 80%.

18. The memory device according to claim 15, further comprising:
a first line;
a second line; and
a capacitor,
wherein one of a source and a drain of the transistor is electrically connected to the first line,
wherein the other of the source and the drain of the transistor is electrically connected to one terminal of the capacitor,
wherein the other terminal of the capacitor is electrically connected to the second line.

19. The memory device according to claim 15, wherein the memory device is a DRAM.

20. A processor comprising:
a timing control circuit;
an instruction decoder operationally connected to the timing control circuit;
a register array;
an address logic and buffer circuit operationally connected to the register array;
a data bus interface operationally connected to the register array;
an arithmetic logic unit operationally connected to the register array; and
an instruction register operationally connected to the instruction decoder and the register array,
wherein at least one of the register array and the instruction register comprises the memory device according to claim 15.

* * * * *